(12) United States Patent
Do et al.

(10) Patent No.: US 12,457,830 B2
(45) Date of Patent: Oct. 28, 2025

(54) DISPLAY DEVICE WITH IMPROVED EMISSION EFFICIENCY AND METHOD FOR MANUFACTURING SAME

(71) Applicant: SAMSUNG DISPLAY CO., LTD., Yongin-si (KR)

(72) Inventors: Young Rag Do, Seoul (KR); Yun Jae Eo, Seoul (KR); Hoo Keun Park, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 357 days.

(21) Appl. No.: 17/423,463

(22) PCT Filed: Nov. 25, 2019

(86) PCT No.: PCT/KR2019/016251
§ 371 (c)(1),
(2) Date: Jul. 15, 2021

(87) PCT Pub. No.: WO2020/149516
PCT Pub. Date: Jul. 23, 2020

(65) Prior Publication Data
US 2022/0069178 A1    Mar. 3, 2022

(30) Foreign Application Priority Data

Jan. 15, 2019   (KR) .................. 10-2019-0005430

(51) Int. Cl.
*H10H 20/853*  (2025.01)
*H01L 25/075*  (2006.01)
*H10H 20/01*   (2025.01)

(52) U.S. Cl.
CPC ....... *H10H 20/853* (2025.01); *H01L 25/0753* (2013.01); *H10H 20/0362* (2025.01)

(58) Field of Classification Search
CPC   H01L 33/54; H01L 25/0753; H01L 2933/005
(Continued)

(56) References Cited

U.S. PATENT DOCUMENTS 6,649,312 B1 *  11/2003  Chari ................. G03C 7/3029
                                                    430/539
11,916,178 B2    2/2024  Kwag et al.
(Continued)

FOREIGN PATENT DOCUMENTS

CN      101241961 A       8/2008
CN      103190004   *    7/2013
(Continued)

OTHER PUBLICATIONS

International Search Report for corresponding Application No. PCT/KR2019/016251 dated Mar. 23, 2020, 4pp.
(Continued)

*Primary Examiner* — Sheng-Bai Zhu
(74) *Attorney, Agent, or Firm* — Womble Bond Dickinson (US) LLP

(57) ABSTRACT

A display device and a method for manufacturing a display device are provided. A display device includes: a base layer; first and second electrodes which are located on the base layer; at least one light emitting diode which is located between the first and second electrodes and configured to emit light; and a protective layer which is located on the base layer and arranged to cover at least the first and second electrodes and the light emitting diode, and the protective layer includes a substrate layer and a light emission pattern formed by at least a partial region protruding from a surface of the substrate layer.

13 Claims, 23 Drawing Sheets

(58) Field of Classification Search
USPC .......................................................... 257/88
See application file for complete search history.

(56) References Cited

U.S. PATENT DOCUMENTS

| | | | |
|---|---|---|---|
| 12,021,170 B2 | 6/2024 | Li et al. | |
| 2005/0067944 A1* | 3/2005 | Masuda | G02B 3/005 |
| | | | 313/503 |
| 2006/0157724 A1 | 7/2006 | Fujita | |
| 2006/0262817 A1* | 11/2006 | Yu | H01L 33/54 |
| | | | 257/E33.059 |
| 2009/0146171 A1* | 6/2009 | Okubo | H01L 33/44 |
| | | | 257/E33.002 |
| 2009/0185393 A1* | 7/2009 | Kang | G02B 6/0073 |
| | | | 362/382 |
| 2009/0321759 A1 | 12/2009 | Xu | |
| 2010/0002449 A1* | 1/2010 | Lin | G02B 19/0028 |
| | | | 427/133 |
| 2010/0200851 A1 | 8/2010 | Oikawa et al. | |
| 2011/0294389 A1 | 12/2011 | Kim | |
| 2011/0316006 A1* | 12/2011 | Xu | H01L 33/56 |
| | | | 438/27 |
| 2012/0248469 A1 | 10/2012 | Choi | |
| 2015/0349207 A1 | 12/2015 | Sogo et al. | |
| 2016/0218143 A1* | 7/2016 | Chaji | H01L 21/6835 |
| 2016/0343919 A1 | 11/2016 | Xu | |
| 2017/0275445 A1 | 9/2017 | Yamashina et al. | |
| 2017/0345982 A1* | 11/2017 | Abe | H01L 33/502 |
| 2018/0175009 A1 | 6/2018 | Kim et al. | |
| 2018/0175104 A1 | 6/2018 | Kang et al. | |
| 2019/0237639 A1* | 8/2019 | Kashihara | H01L 33/54 |
| 2020/0083283 A1* | 3/2020 | Lee | H10K 59/353 |
| 2021/0336095 A1* | 10/2021 | Chen | H01L 33/62 |
| 2022/0093828 A1 | 3/2022 | Kwag et al. | |
| 2025/0107294 A1 | 3/2025 | Kwag et al. | |

FOREIGN PATENT DOCUMENTS

| | | | |
|---|---|---|---|
| CN | 102620215 | * | 8/2014 |
| CN | 112437988 A | | 3/2021 |
| CN | 113169209 A | | 7/2021 |
| CN | 113169210 A | | 7/2021 |
| DE | 102005045587 | * | 3/2006 |
| DE | 10 2008 027 995 A1 | | 2/2009 |
| EP | 2597690 | * | 5/2013 |
| JP | 2005-064111 A | | 3/2005 |
| JP | 2006-520518 A | | 9/2006 |
| JP | 4167717 | * | 10/2008 |
| JP | 2014-033113 A | | 2/2014 |
| JP | 2017-181528 A | | 10/2017 |
| KR | 10-0849814 B1 | | 7/2008 |
| KR | 10-2011-0025187 A | | 3/2011 |
| KR | 10-2011-0130853 A | | 12/2011 |
| KR | 10-2017-0060547 A | | 6/2017 |
| KR | 10-2017-0135689 A | | 12/2017 |
| KR | 10-2018-0072909 A | | 7/2018 |
| WO | WO 2011108309 | * | 9/2011 |
| WO | WO 2016080712 | * | 5/2016 |

OTHER PUBLICATIONS

Extended European Search Report dated Sep. 13, 2022 issued in corresponding EP Application No. 19910310.2, 8 pages.
Korean Office Action issued in corresponding KR Application No. 10-2019-0005430, dated Jun. 11, 2024, 7 pages.
Korean Notice of Allowance issued in corresponding application No. 10-2019-0005430, dated Jul. 21, 2025, 4 pages.

* cited by examiner

[FIG. 23]
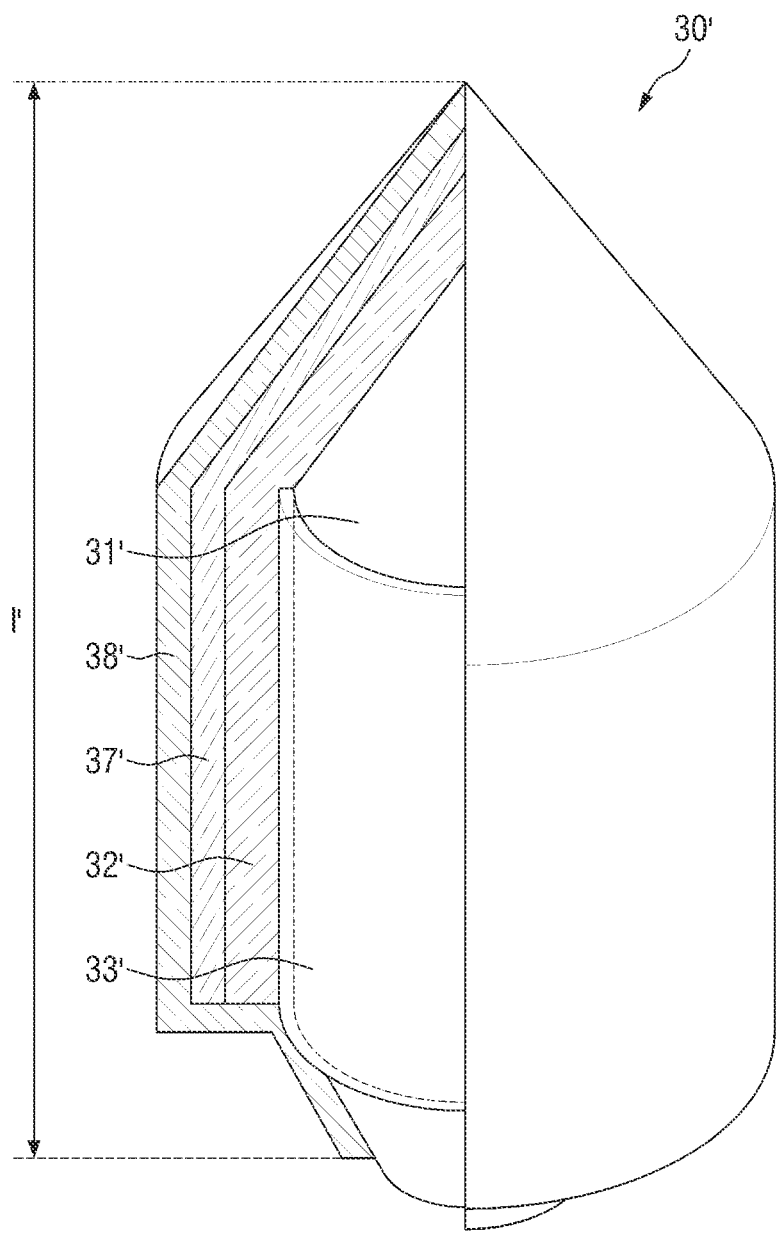

DISPLAY DEVICE WITH IMPROVED EMISSION EFFICIENCY AND METHOD FOR MANUFACTURING SAME

CROSS-REFERENCE TO RELATED APPLICATIONS

This application is a U.S. National Phase Patent Application of International Patent Application Number PCT/KR2019/016251, filed on Nov. 25, 2019, which claims priority to Korean Patent Application Number 10-2019-0005430, filed on Jan. 15, 2019 in the Korean Intellectual Property Office, the entire contents of both of which are incorporated herein by reference.

TECHNICAL FIELD

Aspects of embodiments of the present invention relate to a display device and a method of manufacturing a display device.

BACKGROUND ART

With the development of multimedia, display devices are becoming more important. In response to the development, various types of display devices, such as organic light emitting diode (OLED) display devices, liquid crystal display (LCD) devices, and the like, are being used.

A device for displaying an image of a display device includes a display panel, such as an OLED panel or an LCD panel. Among the above panels, a light emitting display panel may include a light emitting element. For example, a light emitting diode (LED) includes an OLED using an organic material as a fluorescent material, and an inorganic LED using an inorganic material as a fluorescent material.

The inorganic LED using an inorganic semiconductor as a fluorescent material has durability in a high temperature environment and has an advantage of high efficiency of blue light as compared with the OLED. Further, even in a manufacturing process which has been pointed out as a limitation of the conventional inorganic LED element, a transfer method using dielectrophoresis (DEP) has been developed. Therefore, research is being carried out on inorganic LEDs having excellent durability and excellent efficiency as compared with OLEDs.

SUMMARY

According to aspects of embodiments of the present invention, a display device including a plurality of light emitting elements and an insulating layer providing a propagation path for light emitted from the light emitting elements, and a method of manufacturing the same, are provided.

According to an aspect of embodiments of the present invention, a display device with improved top emission efficiency of light emitted from a light emitting element is provided.

It should be noted that aspects of the present invention are not limited to the above-described aspects, and other aspects and objects of the present invention will be apparent to those skilled in the art from the following descriptions.

According to one or more embodiments, a display device comprises: a base layer; a first electrode and a second electrode which are disposed on the base layer; at least one light emitting element disposed between the first electrode and the second electrode and configured to emit light; and a protective layer disposed on the base layer to cover at least the first electrode, the second electrode, and the at least one light emitting element, wherein the protective layer includes a base material layer and a light emission pattern in which at least a partial region of a surface of the base material layer protrudes.

At least a portion of the light emitted from the light emitting element may be incident on the light emission pattern, and at least a portion of the incident light may be emitted from the light emission pattern to the surface of the base material layer in an upward direction.

The light emission pattern may include at least one protrusion in which at least the partial region of the surface of the base material layer protrudes.

A protrusion of the at least one protrusion may have a curved shape of which an outer surface protrudes from the surface of the base material layer.

The protrusion may have a shape extending from the surface of the base material layer in one direction.

The outer surface of the protrusion may have a height of a highest point protruding from the surface of the base material layer in a range of 10 μm to 50 μm and have a diameter in a range of 20 μm to 100 μm.

The outer surface of the protrusion may have a tangent angle formed with the surface of the base material layer in a range of 30° to 80°.

The outer surface of the protrusion may be inclined from the surface of the base material layer.

The base material layer may include a transparent insulating material.

The base material layer may further include at least one bead, and the light emission pattern may be formed such that the at least one bead is disposed on the base material layer.

At least a partial region of the at least one bead may be exposed on the surface of the base material layer.

At least a portion of the light emitted from the light emitting element may be incident on the at least one bead, and the incident light may be scattered in the at least one bead.

The base layer may include a light emission area defined as an area in which the at least one light emitting element is disposed, and the base material layer may be disposed to cover the light emission area on the base layer.

The light emission pattern may be disposed on at least a partial region on the base material layer and overlap an alignment area.

According to one or more embodiments, a method of manufacturing a display device comprises: preparing a first electrode and a second electrode disposed on a target substrate, and light emitting elements disposed between the first electrode and the second electrode, forming a base material layer on the target substrate and covering at least the first electrode, the second electrode, and the light emitting elements, and forming a light emission pattern, in which at least a partial region of a surface of the base material layer protrudes, on the base material layer.

The light emission pattern may be disposed on at least a partial region on the base material layer and overlap the light emitting elements.

The forming of the light emission pattern may include pressing and molding the surface of the base material layer using a mold having a surface of which a partial region is depressed.

The light emission pattern may include at least one protrusion in which at least a partial region of the surface of the base material layer protrudes.

The base material layer may further include at least one bead, and the light emission pattern may be formed such that the at least one bead is disposed on the base material layer.

In the forming of the light emission pattern, at least a partial region of the at least one bead included in the base material layer may be exposed on the surface of the base material layer so as to form the light emission pattern.

Further details of embodiments are included in the detailed description and the accompanying drawings.

In a display device according to one or more embodiments, a protective layer including a light emission pattern, of which at least a partial region protrudes, may be included, and light emitted from a light emitting element can be emitted through a light emission pattern of the protective layer.

In addition, in a display device according to one or more embodiments, a protective layer which provides a propagation path of the light emitted from the light emitting element may be included such that top emission efficiency can be improved.

However, aspects and effects according to the embodiments are not limited to those described above, and more various aspects and effects are included in this disclosure.

DESCRIPTION OF DRAWINGS

FIG. 23 is a schematic diagram of a light emitting element according to one embodiment.

DETAILED DESCRIPTION

The present invention will now be described more fully hereinafter with reference to the accompanying drawings, in which some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or one or more intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, some embodiments of the present invention will be described with reference to the accompanying drawings.

Figure 1:
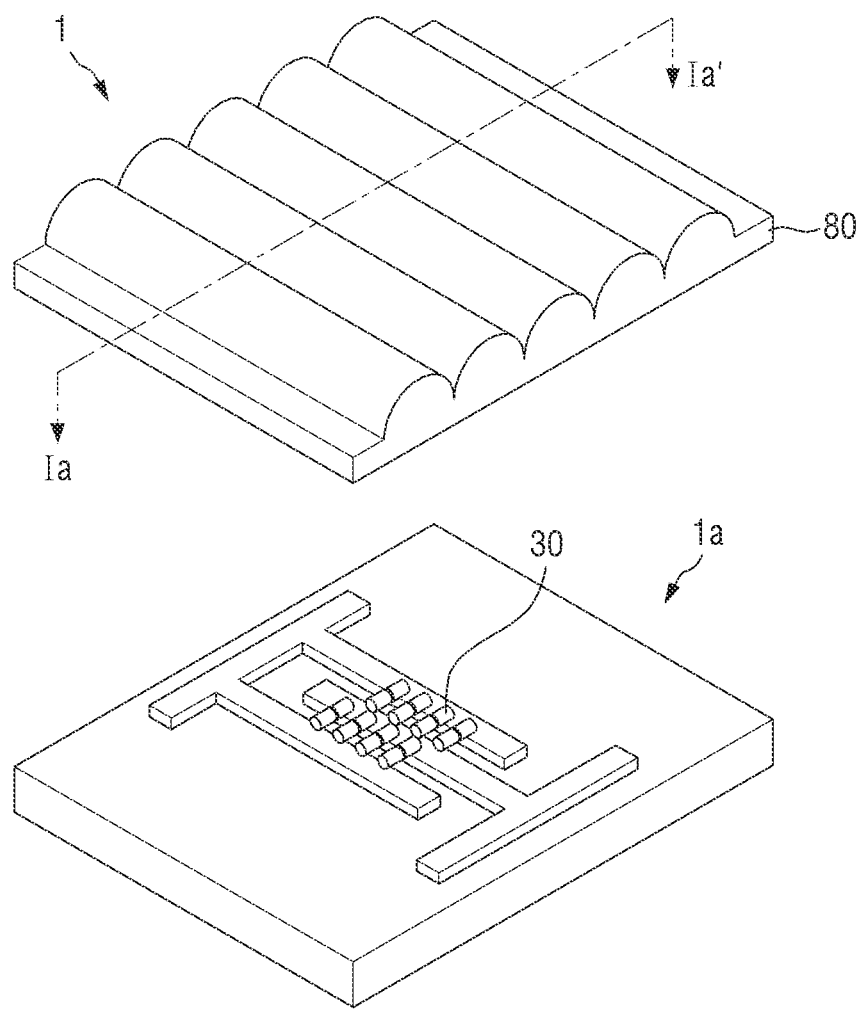
FIG. 1 is a schematic perspective view illustrating a display device according to one embodiment.
Figure 2:
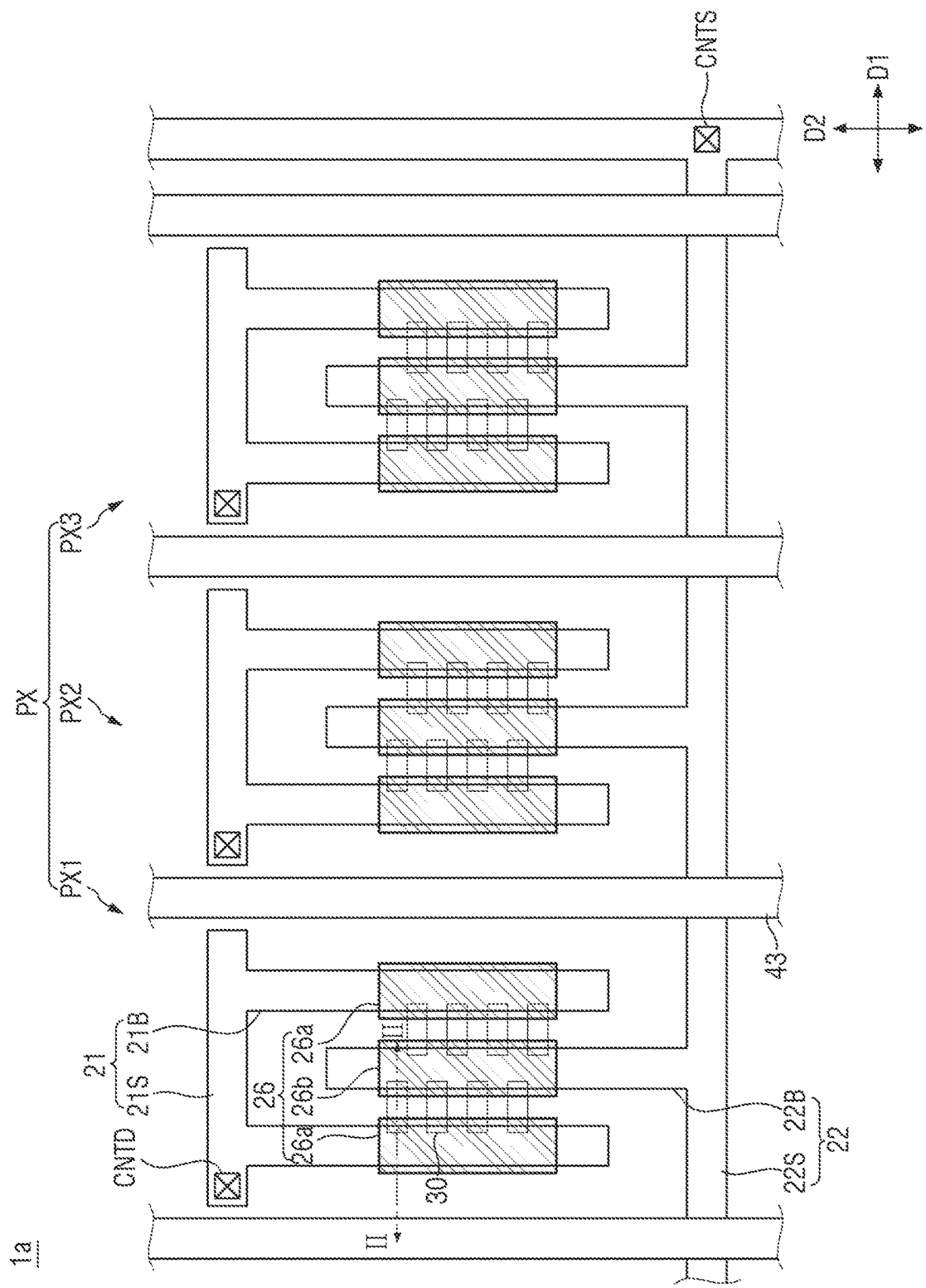
FIG. 2 is a plan view illustrating a display element layer of a display device according to one embodiment.

FIG. 1 is a schematic perspective view illustrating a display device according to one embodiment. FIG. 2 is a plan view illustrating a display element layer of a display device according to one embodiment.

Referring to FIGS. 1 and 2, a display device 1 includes a display element layer 1a including light emitting elements 30 emitting light in a specific wavelength range, and a protective layer 80 disposed to cover (e.g., entirely cover) the display element layer 1a. Although the display element layer 1a and the protective layer 80 have been illustrated as being spaced apart from each other in FIG. 1, the protective layer 80 may be directly formed on the display element layer 1a. FIG. 2 is a plan view illustrating the display element layer 1a of the display device 1 of FIG. 1 viewed from the top, and FIG. 1 illustrates only one sub-pixel in the display element layer 1a of FIG. 2. That is, it may be understood that the protective layer 80 of the display device 1 is not shown in FIG. 2.

The display device 1 may include a plurality of pixels PX. Each pixel PX may include one or more light emitting elements 30, which emit light in a specific wavelength range, to display a specific color.

In an embodiment, each pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be a red color, the second color may be a green color, and the third color may be a blue color, but the present invention is not limited thereto, and the sub-pixels PXn may emit light of the same color. In addition, although each pixel PX has been illustrated as including three sub-pixels in FIG. 2, the present invention is not limited thereto, and, in an embodiment, each pixel PX may include a larger number of sub-pixels.

Meanwhile, in this disclosure, terms "first," "second," and the like are used to refer to each of components, but these are used to simply distinguish the components from each other and do not necessarily refer to a corresponding component. That is, the components defined as first, second, and the like are not necessarily limited to a specific structure or location and, in some cases, other numbers may be assigned to the components. Therefore, the number assigned to each component may be described through the drawings and the following description, and a first component mentioned below may be a second component within the technical idea of the present invention.

Figure 5:
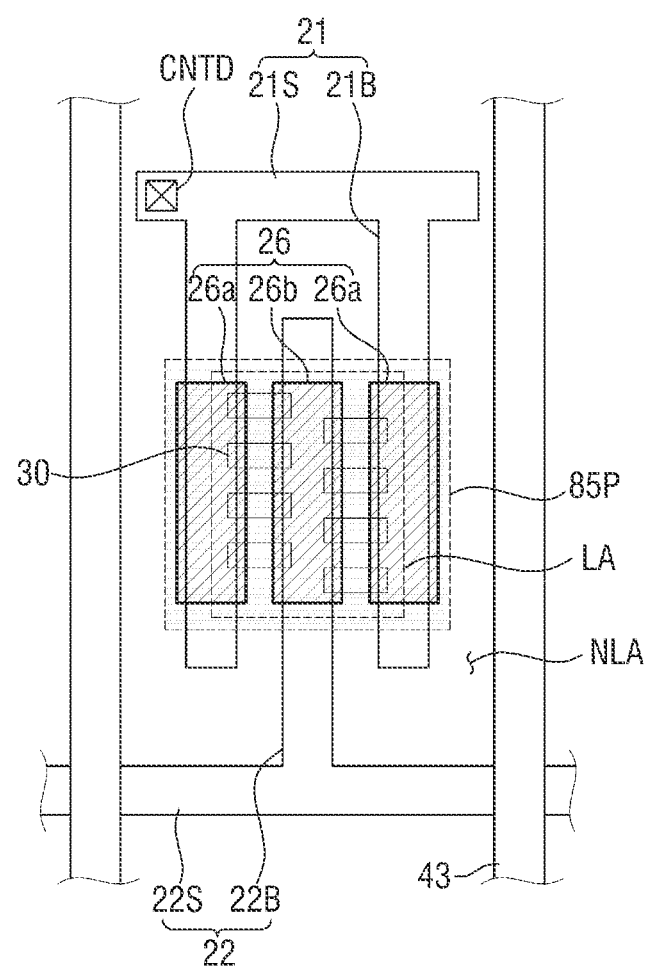
FIG. 5 is a schematic diagram of a pixel of a display device according to one embodiment.

Each sub-pixel PXn of the display device 1 may include areas defined as a light emission area LA (see FIG. 5) and a non-light emission area NLA (see FIG. 5). The light emission area LA is defined as an area in which the light emitting elements 30 included in the display device 1 are disposed to emit light in a specific wavelength range. The non-light emission area NLA may be an area other than the light emission area LA and may be defined as an area in which the light emitting elements 30 are not disposed and light is not emitted.

The sub-pixel PXn of the display device 1 may include a plurality of banks, a plurality of electrodes 21 and 22, and the light emitting elements 30.

The plurality of electrodes 21 and 22 may be electrically connected to the light emitting elements 30 and may receive a voltage (e.g., a predetermined voltage) so as to allow the light emitting elements 30 to emit light. In addition, in order to align the light emitting elements 30, at least a portion of each of the electrodes 21 and 22 may be utilized to form an electric field in the sub-pixel PXn.

The plurality of electrodes 21 and 22 may include a first electrode 21 and a second electrode 22. In an example, the first electrode 21 may be a pixel electrode which is separated in each sub-pixel PXn, and the second electrode 22 may be a common electrode which is commonly connected along the sub-pixels PXn. One of the first electrode 21 and the second electrode 22 may be an anode electrode of the light emitting element 30, and the other thereof may be a cathode electrode of the light emitting element 30. However, the present invention is not limited thereto and the reverse of the above description may be possible.

The first electrode 21 and the second electrode 22 may respectively include electrode stem portions 21S and 22S disposed to extend in a first direction D1 and include electrode branch portions 21B and 22B extending and branching from the electrode stem portions 21S and 22S in a second direction D2 intersecting the first direction D1.

The first electrode 21 may include a first electrode stem portion 21S disposed to extend in the first direction D1, and at least one first electrode branch portion 21B branching from the first electrode stem portion 21S to extend in the second direction D2.

Two ends of the first electrode stem portion 21S of any one pixel may be separated to be terminated between the sub-pixels PXn and disposed to be substantially collinear with a first electrode stem portion 21S of an adjacent sub-pixel PXn (e.g., a sub-pixel which is adjacent in the first direction D1) belonging to the same row. Thus, the first electrode stem portion 21S disposed in each sub-pixel PXn may apply different electrical signals to first electrode branch portions 21B, and the first electrode branch portions 21B may be driven separately.

The first electrode branch portion 21B branches from at least a portion of the first electrode stem portion 21S and is disposed to extend in the second direction D2. The first electrode branch portion 21B may be terminated in a state of being separated from the second electrode stem portion 22S which is disposed opposite to the first electrode stem portion 21S.

The second electrode 22 may include the second electrode stem portion 22S which extends in the first direction D1 and is disposed to be separated from and opposite to the first electrode stem portion 21S, and the second electrode branch portion 22B which branches from the second electrode stem portion 22S and is disposed to extend in the second direction D2. However, one end portion of the second electrode stem portion 22S may extend to a plurality of adjacent sub-pixels PXn in the first direction D1. Thus, the two ends of the second electrode stem portion 22S of any one pixel may be connected to a second electrode stem portion 22S of an adjacent pixel PX among the pixels PX.

The second electrode branch portion 22B may be separated from and opposite to the first electrode branch portion 21B and terminated in a state of being separated from the first electrode stem portion 21S. That is, one end portion of the second electrode branch portion 22B may be connected to the second electrode stem portion 22S, and the other end portion thereof may be disposed in the sub-pixel PXn in a state of being separated from the first electrode stem portion 21S.

In the drawing, two first electrode branch portions 21B have been illustrated as being disposed and the second electrode branch portion 22B has been illustrated as being disposed between the two first electrode branch portions 21B, but the present invention is not limited thereto.

The plurality of banks may include a third bank 43 disposed at a boundary between the sub-pixels PXn, and a first bank 41 and a second bank 42 which are respectively disposed below the electrodes 21 and 22. Although the first bank 41 and the second bank 42 are not illustrated in FIG. 2, the first bank 41 and the second bank 42 may be disposed below the first electrode branch portion 21B and the second electrode branch portion 22B, respectively.

The third bank 43 may be disposed at a boundary between the sub-pixels PXn. End portions of the plurality of first electrode stem portions 21S may be separated from each other to be terminated based on the third bank 43. The third bank 43 may extend in the second direction D2 and may be disposed at the boundary between the sub-pixels PXn disposed in the first direction D1. However, the present invention is not limited thereto, and the third bank 43 may extend in the first direction D1 and may be disposed even at the boundary between the sub-pixel PXn disposed in the second direction D2. In an embodiment, the third bank 43 may include a same material as the first bank 41 and the second bank 42 and may be formed in substantially a same process.

Although not shown in the drawing, a first insulating layer 51 may be disposed in each sub-pixel PXn to cover (e.g., entirely cover) each sub-pixel PXn including the first electrode branch portion 21B and the second electrode branch portion 22B. The first insulating layer 51 may protect each of the electrodes 21 and 22 and, concurrently (e.g., simultaneously), insulate the electrodes 21 and 22 from each other so as not to be in direct contact with each other.

The plurality of light emitting elements 30 may be disposed between the first electrode branch portion 21B and the second electrode branch portion 22B. First end portions of at least some of the plurality of light emitting elements 30 may be electrically connected to the first electrode branch portion 21B and second end portions thereof may be electrically connected to the second electrode branch portion 22B.

In an embodiment, the plurality of light emitting elements 30 may be separated from each other in the second direction D2 and disposed substantially parallel to each other. A separation gap between the light emitting elements 30 is not particularly limited. In some cases, a plurality of the light emitting elements 30 may be disposed adjacent to each other to form a group, and a plurality of other light emitting elements 30 may be grouped in a state of being spaced at regular intervals from each other, may have a nonuniform density, and may be oriented and aligned in one direction.

A contact electrode 26 may be disposed on the first electrode branch portion 21B and the second electrode branch portion 22B. However, the contact electrode 26 may be substantially disposed on the first insulating layer 51, and at least a portion of the contact electrode 26 may be in contact with and electrically connected to the first electrode branch portion 21B and the second electrode branch portion 22B.

A plurality of contact electrodes 26 may be disposed to extend in the second direction D2 and be disposed to be separated from each other in the first direction D1. The contact electrode 26 may be in contact with at least one end portion of the light emitting element 30, and the contact electrode 26 may be in contact with the first electrode 21 or the second electrode 22 to receive an electrical signal. Thus, the contact electrode 26 may transmit an electrical signal, which is transmitted from each of the electrodes 21 and 22, to the light emitting element 30.

The contact electrode 26 may include a first contact electrode 26a and a second contact electrode 26b. The first contact electrode 26a may be disposed on the first electrode branch portion 21B to be in contact with a first end portion of the light emitting element 30, and the second contact electrode 26b may be disposed on the second electrode branch portion 22B to be in contact with a second end portion thereof.

The first electrode stem portion 21S and the second electrode stem portion 22S may be electrically connected to a circuit element layer of the display device 1 through contact holes, for example, a first electrode contact hole CNTD and a second electrode contact hole CNTS. In FIG. 2, one second electrode contact hole CNTS has been illustrated as being formed in the second electrode stem portion 22S of each of the plurality of sub-pixels PXn. However, the present invention is not limited thereto, and, in some cases, the second electrode contact hole CNTS may be formed in each sub-pixel PXn.

In addition, the display device 1 may include a second insulating layer 52 (see FIG. 6) and the protective layer 80 (see FIG. 1) which are disposed to cover at least a portion of each of the electrodes 21 and 22 and the light emitting element 30. An arrangement and structures thereof will be described below.

The protective layer 80 is disposed on the display element layer 1a and may perform a function of protecting members disposed on the display element layer 1a from an external environment. In addition, the protective layer 80 may include a light emission pattern 85P formed in at least a partial region thereof and provide a propagation path of light emitted from the light emitting element 30.

Figure 3:
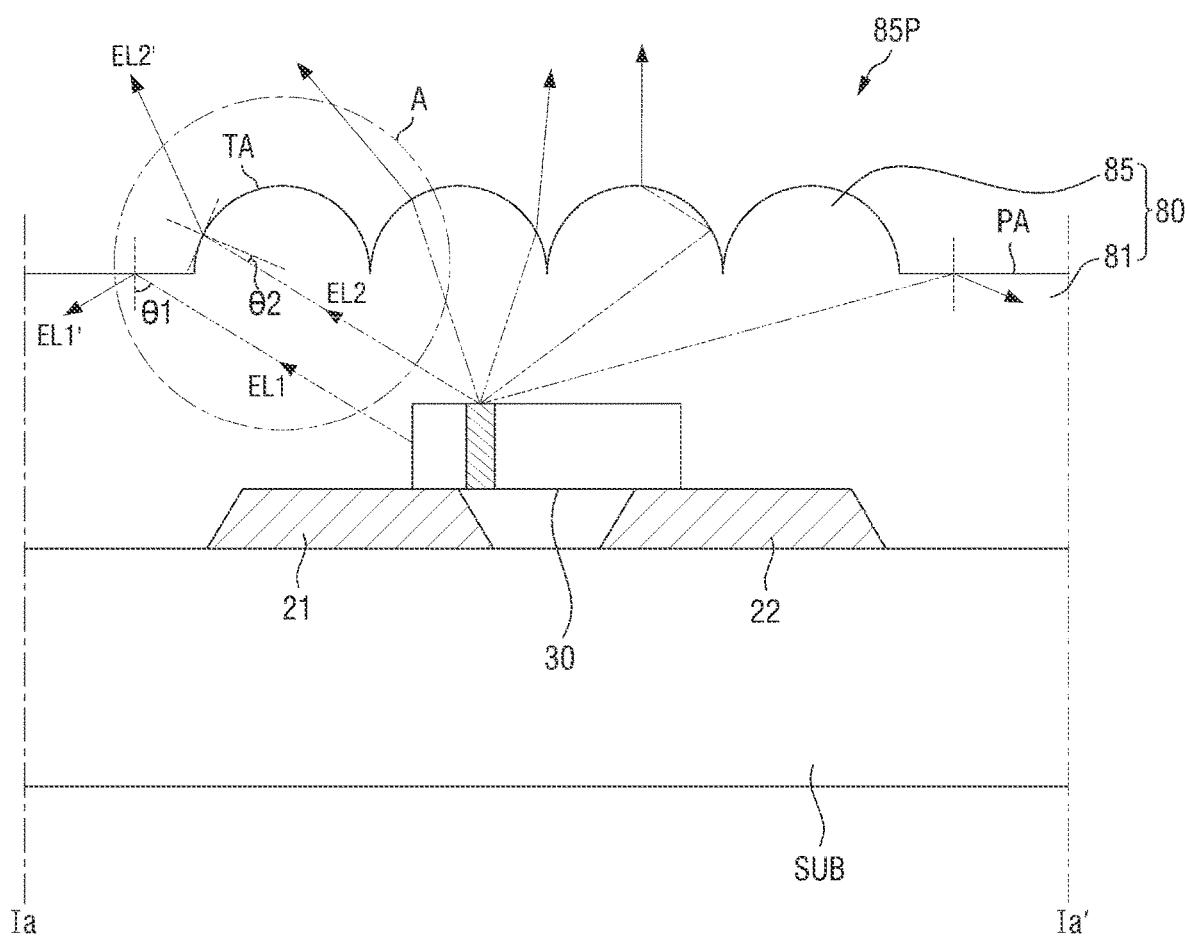
FIG. 3 is a schematic cross-sectional view taken along line Ia-Ia' of FIG. 1.
Figure 4:
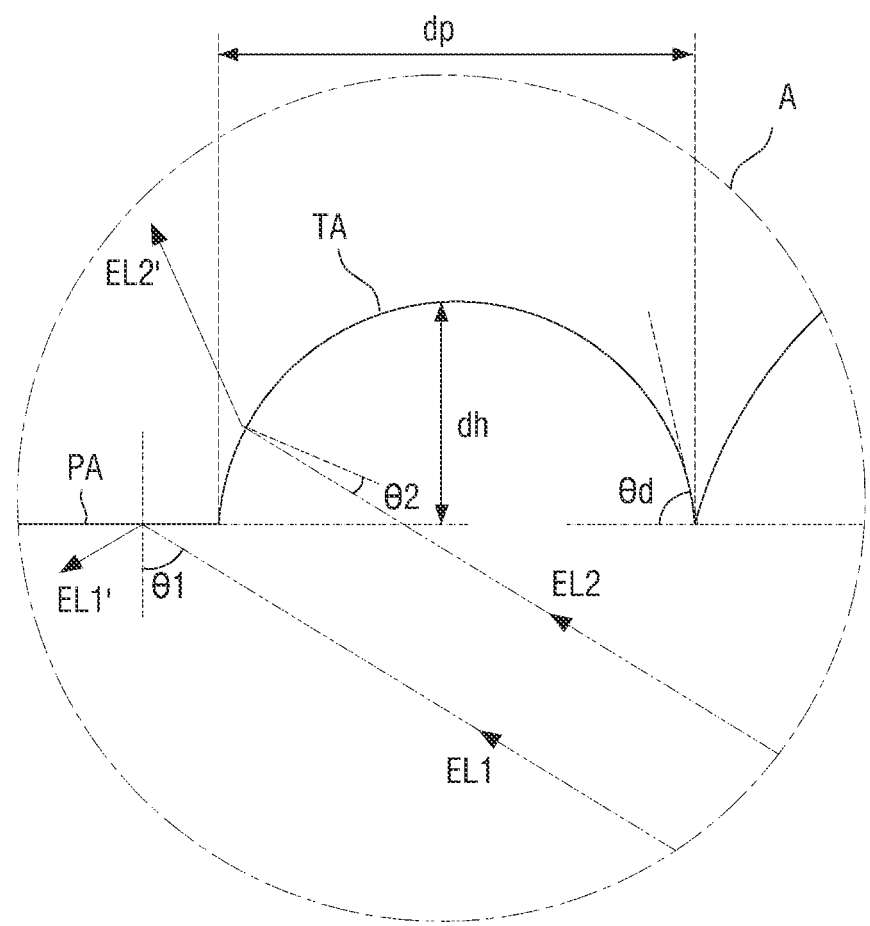
FIG. 4 is an enlarged view of a region "A" of FIG. 3.

FIG. 3 is a schematic cross-sectional view taken along line Ia-Ia' of FIG. 1; and FIG. 4 is an enlarged view of a region "A" of FIG. 3.

Referring to FIGS. 3 and 4, the protective layer 80 is disposed to cover the electrodes 21 and 22 and the light emitting elements 30, which are disposed on a target substrate SUB. In FIG. 3, only the electrodes 21 and 22 and the light emitting element 30 are illustrated among components of the display element layer 1a, but the present invention is not limited thereto, and the display element layer 1a may include a larger number of members or components. A description thereof will be made below with reference to other drawings.

The protective layer 80 includes a base material layer 81 and a light emission pattern 85P. The base material layer 81 may be a layer of the protective layer 80 and may be disposed to cover (e.g., cover an entirety of) the target substrate SUB. The base material layer 81 is disposed to cover the electrodes 21 and 22 and the light emitting element 30, thereby performing a function of protecting the electrodes 21 and 22 and the light emitting element 30. For example, in order to prevent or substantially prevent external air or moisture from infiltrating therein, the base material layer 81 may include a material having a property of low air and moisture transmittance.

The base material layer 81 may include a transparent insulating material. The base material layer 81 covering the light emitting element 30 may include a transparent material to allow light emitted from the light emitting element 30 to be displayed on the display device 1. In addition, the base material layer 81 may be disposed to cover the electrodes 21 and 22 to electrically insulate the electrodes 21 and 22 from each other. Although not shown in the drawings, the base material layer 81 may be disposed to fill in a gap space between members disposed on the display element layer 1a, Since the gap space between the light emitting element 30 and the electrodes 21 and 22 is filled with the base material layer 81, the base material layer 81 may perform a function of preventing or substantially preventing the light emitting element 30 and the electrodes 21 and 22 from being damaged due to other members and a function of electrically insulating the light emitting element 30 and the electrodes 21 and 22 from each other.

In an embodiment, the base material layer 81 may include at least one among a polyester-based compound, an olefin-based compound, an acrylic-based compound, an epoxy-based compound, a polyamide-based compound, a polyimide-based compound, a urethane-based compound, and a silicone compound. In an embodiment, when the base material layer 81 includes a silicone compound, the silicone compound may be polysilane oxide, polysiloxane oxide, or silicon oxide.

The light emission pattern 85P is formed on at least a partial region of the base material layer 81. In an embodiment, the light emission pattern 85P may be formed on an entirety of the base material layer 81 and may overlap an area in addition to an area in which the light emitting element 30 of the display element layer 1a is disposed. However, the present invention is not limited thereto, and, in an embodiment, the light emission pattern 85P may be formed only in a partial region on the base material layer 81. For example, the light emission pattern 85P may be formed to overlap a region in which the light emitting element 30 of the display element layer 1a is disposed. A further detailed description thereof will be made with reference to other drawings.

At least a partial region of the light emission pattern 85P according to one embodiment may include protrusions 85 protruding from the base material layer 81. The light emission pattern 85P may include a plurality of protrusions 85, and the protrusions 85 may be disposed adjacent to each other on the base material layer 81. However, the present invention is not limited thereto, and the protrusions 85 may be disposed to be spaced apart from each other.

The protrusion 85 forms an outer surface TA protruding upward from a flat surface PA of the base material layer 81. In an example, in a cross-sectional view, the protrusion 85 may have a shape in which at least a partial region of the outer surface TA is curved and extends in one direction on the base material layer 81. As shown in the drawing, in an embodiment, the outer surface TA of the protrusion 85 may have a convexly round shape from the surface PA of the base material layer 81 and may extend in one direction on the surface PA of the base material layer 81. That is, the light emission pattern 85P including the protrusion 85 may have a lenticular shape.

However, the shape of the protrusion 85 is not particularly limited as long as the light emitted from the light emitting element 30 of the display element layer 1*a* can be refracted and emitted without being reflected from the base material layer 81. For example, a portion of the outer surface TA of the protrusion 85 may be formed to be linearly inclined or may form one unit without extending on the base material layer 81. In addition, the plurality of protrusions 85 included in the light emission pattern 85P may not necessarily have the same size, and may have different sizes. A more detailed description thereof will be provided below with reference to other embodiments.

Meanwhile, light emitted from the light emitting element 30 may be incident on an interface between the base material layer 81 and the outside through the base material layer 81. Here, a material included in the base material layer 81 may have a refractive index (e.g., a predetermined refractive index), and the light may be reflected on the interface between the base material layer 81 and the outside to propagate to the display element layer 1*a* again. At least a portion of the light emitted from the light emitting element 30 may not be emitted from the display device 1.

According to one embodiment, the protective layer 80 includes the light emission pattern 85P formed on the base material layer 81, and light emitted from the light emitting element 30 is incident on the light emission pattern 85P. The light emission pattern 85P may adjust an incident angle of the light incident on the interface between the base material layer 81 and the outside to reduce reflection of the light. Thus, it is possible to reduce a quantity of light emitted from the light emitting element 30 and then reflected in the protective layer 80 and increase a quantity of light passing through and emitted from the protective layer 80. That is, the light emission pattern 85P of the protective layer 80 may improve the top emission efficiency of the display device 1.

The light emitted from the light emitting element 30 may include first light EL1 incident on the surface PA of the base material layer 81 and second light EL2 incident on the outer surface TA of the protrusion 85.

The first light EL1 of the light emitted from the light emitting element 30 may propagate toward the surface PA of the base material layer 81 at a first incident angle θ1. In this case, the first light EL1 incident at the first incident angle θ1 may be reflected from the surface PA of the base material layer 81 to propagate to the display element layer 1*a* (see EL1' in FIGS. 3 and 4). The reflected first light EL1' may not be emitted to the outside of the protective layer 80 to propagate in the protective layer 80.

The second light EL2 propagating in the same direction as the first light EL1 may propagate toward the outer surface TA of the protrusion 85. Even when the second light EL2 propagates in the same manner as the first light EL1, the second light EL2 may be incident toward the outer surface TA protruding further than the surface PA of the base material layer 81 at a second incident angle θ2 different from the first incident angle θ1. In this case, the second light EL2 may be refracted and emitted without being reflected on the interface between the outer surface TA and the outside.

That is, the protective layer 80 includes the light emission pattern 85P formed on the base material layer 81, and, thus, a quantity of light emitted toward an upper portion of the target substrate SUB of the light emitted from the light emitting element 30 may be increased. The protective layer 80 may increase the quantity of the second light EL2 of the light, which is emitted from the light emitting element 30, emitted to the outside through the light emission pattern 85P more than the quantity of the first light EL1 reflected from the interface between the base material layer 81 and the outside. The protective layer 80 according to one embodiment may perform a function of protecting the display element layer 1*a* from the outside and, concurrently (e.g., simultaneously), provide a propagation path through which the light of the light emitting element 30 is emitted from the protective layer 80, and, thus, the display device 1 may improve the top emission efficiency of the light emitting element 30.

The protrusion 85 of the light emission pattern 85P may have a size within a specific range to allow the light emitted from the light emitting element 30 to propagate toward an upper surface of the protective layer 80. In an example, as shown in FIG. 4, when the protrusion 85 of the light emission pattern 85P has the outer surface TA having a curved shape, the protrusion 85 may have a height dh in a range from 10 μm to 50 μm at the highest point of the outer surface TA and a diameter dp in a range from 20 μm to 100 μm.

When the height dh is less than 10 μm at the highest point of the outer surface TA, there is a problem in that it is difficult for the protrusion 85 to be maintained in a shape, and when the height dh is greater than 50 μm, total reflection of the incident light is increased such that the top emission efficiency may be decreased. In addition, when the diameter dp of the protrusion 85 is less than 20 μm, the number of protrusions 85 per unit area of the base material layer 81 is excessively increased such that light efficiency may be decreased or there may be a difficulty in implementing the light emission pattern 85P. On the other hand, when the diameter dp is greater than 100 μm, a Moire phenomenon may occur.

In addition, in an example, a tangent angle θd between the outer surface TA of the protrusion 85 and the surface PA of the base material layer 81 may be in a range from 30° to 80°. When the tangent angle θd is less than 30°, light collection efficiency may be degraded, and when the tangent angle θd is greater than 80°, it may be difficult to manufacture the shape of the protrusion 85. The protective layer 80 according to one embodiment may include the protrusion 85 having a size within the above-described range, and, thus, a ratio of the light emitted from the light emitting element 30 to the light propagating the upper portion of the protective layer 80 may be maximized or increased. Meanwhile, as described above, in the drawings, the protrusions 85 have been illustrated as having the same diameter dp, the same height dh, and the same tangent angle θd, but the present invention is not limited thereto. That is, the light emission pattern 85P may include protrusions 85 having different diameters dp, different heights dh, and/or different tangent angles θd.

Figure 11:
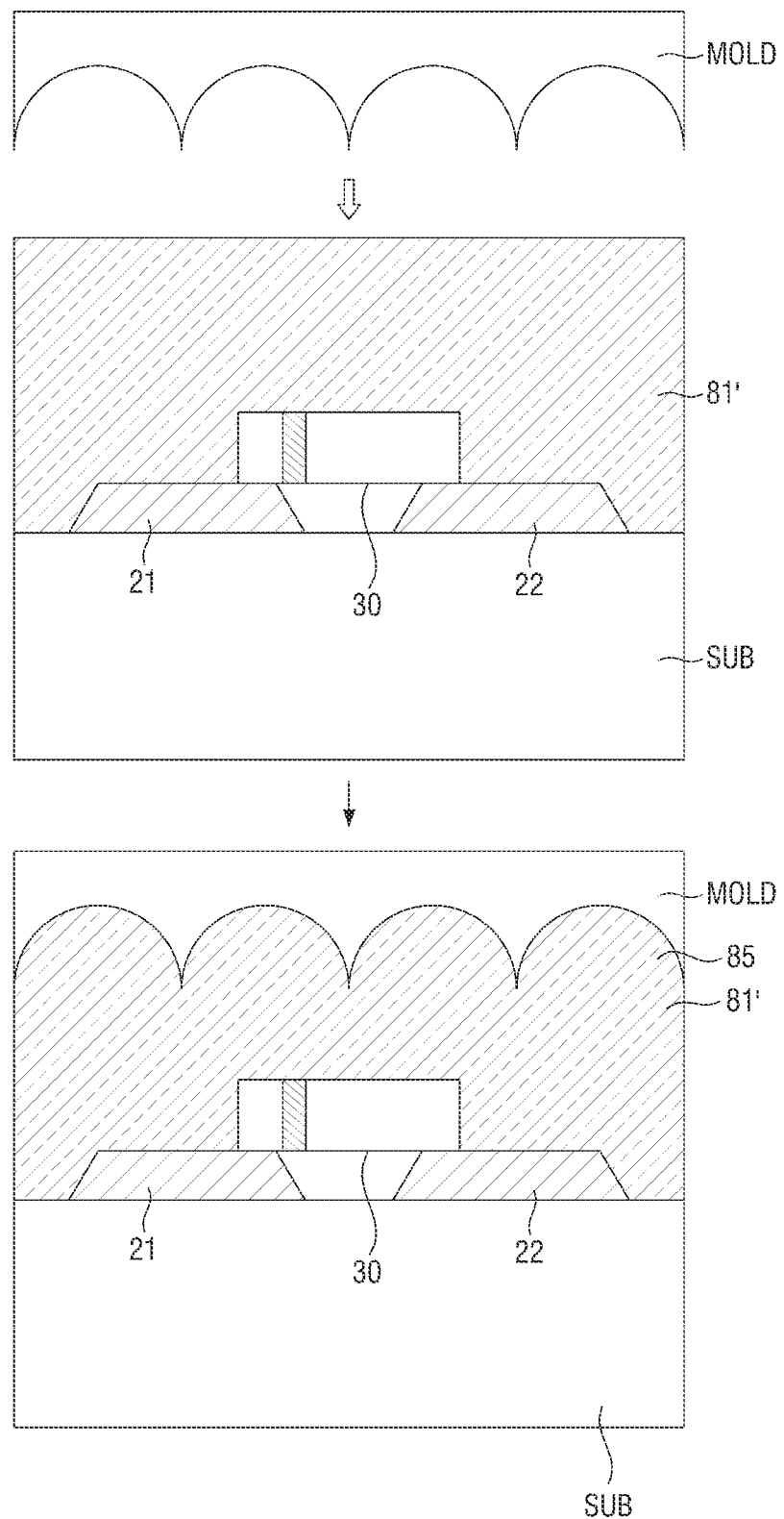

In an embodiment, the light emission pattern 85P including the protrusions 85 may be formed by forming a material constituting the base material layer 81 in a manufacturing process of the protective layer 80 and then molding the material using a mold MOLD (see FIG. 11). The light emission pattern 85P may be formed by forming a material constituting the base material layer 81 on the display element layer 1a and then molding the material using the mold MOLD having an inverse shape of the protrusion 85 of the light emission pattern 85P. A further detailed description thereof will be provided below.

Meanwhile, as described above, the protrusions 85 may be formed on an entirety of the base material layer 81 or formed in only a partial region thereof. In an example, the protrusions 85 of the protective layer 80 may be formed to overlap an area in which the light emitting elements 30 of the display element layer 1a are disposed.

FIG. 5 is a schematic diagram of a pixel of a display device according to one embodiment.

Referring to FIG. 5, in a display device 1, a plurality of light emitting elements 30 may be disposed in each pixel PX or each sub-pixel PXn, and a light emission area LA in which the light emitting elements 30 are disposed and a non-light emission area NLA excluding the light emission area LA may be defined. The light emitting elements 30 are disposed between electrodes 21 and 22 disposed in each pixel PX or each sub-pixel PXn, and a region in which the light emitting elements 30 are disposed and other regions are defined within each pixel PX or each sub-pixel PXn. In the light emission area LA, light is emitted from the light emitting element 30, and the light is incident on a protective layer 80. A light emission pattern 85P is formed on the protective layer 80 to allow the light incident on the protective layer 80 to propagate toward an upper portion of a target substrate SUB.

In an example, a region 85P (see FIG. 5) in which the light emission pattern 85P is formed on the protective layer 80 may overlap at least the light emission area LA. That is, the light emission pattern 85P is formed to overlap at least the light emission area LA on a base material layer 81. In an embodiment, the light emission pattern 85P may not be formed in the region overlapping the non-light emission area NLA on the base material layer 81 of the protective layer 80, and the region may form a flat surface. Thus, a quantity of light emitted from the light emitting element 30 and then incident on the light emission pattern 85P (the second light EL2 in FIG. 4) may be increased to improve the top emission efficiency of the display device 1. However, the present invention is not limited thereto, and, in an embodiment, the light emission pattern 85P may be disposed to entirely cover the display element layer 1a by including the non-light emission area NLA in addition to the light emission area LA on the base material layer 81.

In addition, although not shown in the drawings, in an embodiment, a reflective material layer may be further disposed in a region in which the light emission pattern 85P of the base material layer 81 is not disposed so as to reflect the light incident on the surface PA of the base material layer 81 (the first light EL1 in FIG. 4) to the light emission pattern 85P. First light EL1 incident on the one surface PA of the base material layer 81 may be reflected from the reflective material layer to be directed to the display element layer 1a and then reflected again from the display element layer 1a to be incident on the light emission pattern 85P. The first light EL1 may be reflected several times in the protective layer 80 to be emitted through the light emission pattern 85P.

Hereinafter, the display element layer 1a of the display device 1 will be described in further detail with reference to other drawings.

Figure 6:
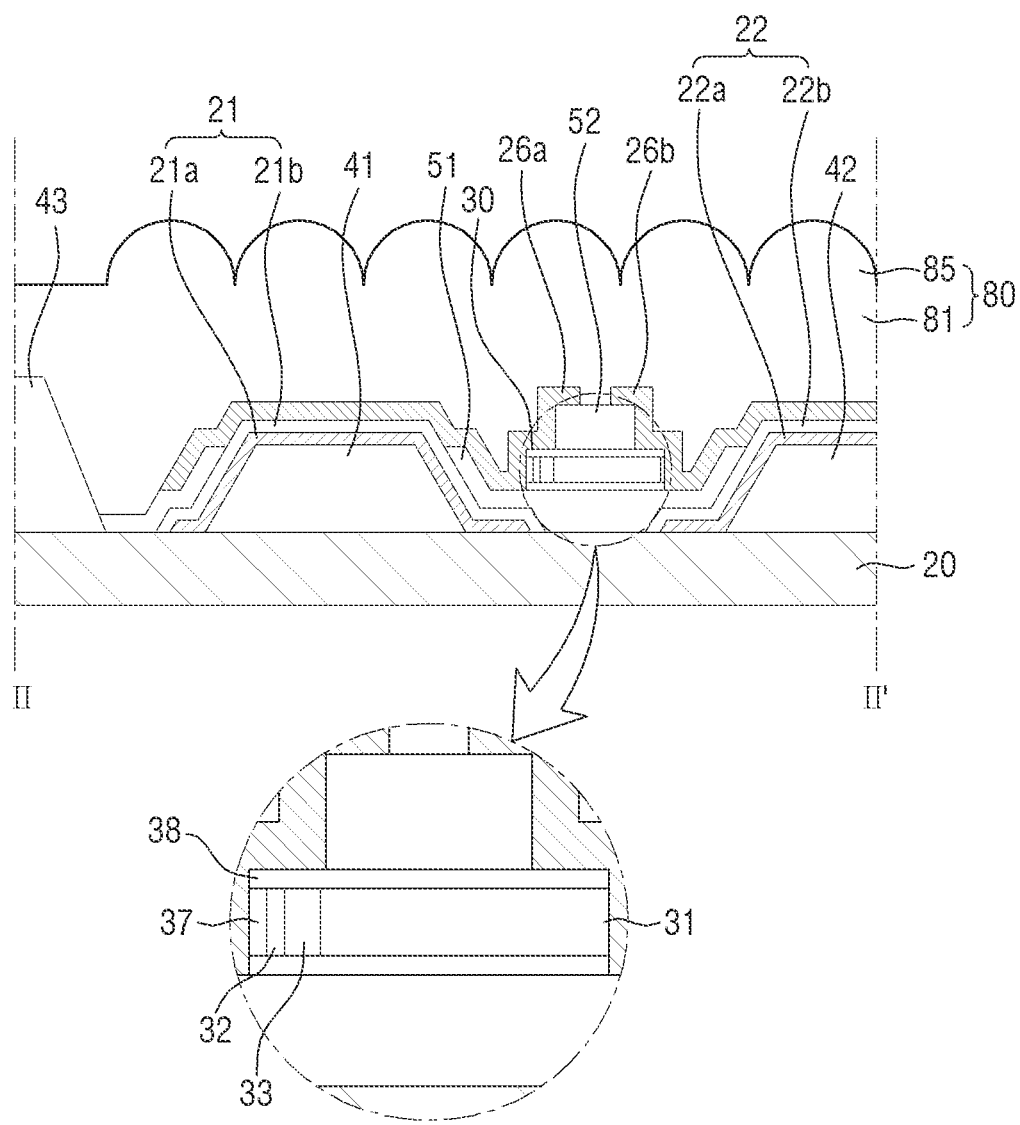
FIG. 6 is a cross-sectional view taken along line II-II' of FIG. 2.

FIG. 6 is a partial cross-sectional view of the display device taken along line II-II' of FIG. 2.

FIG. 6 illustrates a cross-sectional view of a region of the first sub-pixel PX1 and may be equally applied to other pixels PX or other sub-pixels PXn. FIG. 6 illustrates a cross-section crossing a first end portion and a second end portion of an arbitrary light emitting element 30.

Meanwhile, although not shown in FIG. 6, the display device 1 may further include circuit element layers located below the electrodes 21 and 22. The circuit element layers may include a plurality of semiconductor layers and a plurality of conductive patterns and may include at least one transistor and a power line. However, a detailed description thereof will be omitted below.

To describe the display device 10 in further detail with reference to FIG. 6, the display device 1 may include a via layer 20, the electrodes 21 and 22 disposed on the via layer 20, and the light emitting element 30. A circuit element layer (not shown) may be further disposed below the via layer 20. The via layer 20 may include an organic insulating material and perform a surface planarization function.

A plurality of banks 41, 42, and 43 are disposed on the via layer 20. The plurality of banks 41, 42, and 43 may be disposed to be separated from each other in each sub-pixel PXn. The plurality of banks 41, 42, and 43 may include the first bank 41 and the second bank 42 which are disposed adjacent to a central portion of the sub-pixel PXn, and the third bank 43 disposed at a boundary between the sub-pixels PXn.

In an embodiment, when an ink is sprayed using an inkjet printing device during the manufacturing of the display device 1, the third bank 43 may perform a function of blocking the ink from crossing a boundary of the sub-pixel PXn. In addition, in an embodiment, the display device 1 may further include one or more other members disposed on the third bank 43, and the third bank 43 may perform a function of supporting the other members. However, the present invention is not limited thereto.

The first bank 41 and the second bank 42 are disposed to be separated from and opposite to each other. The first electrode 21 may be disposed on the first bank 41, and the second electrode 22 may be disposed on the second bank 42. Referring to FIGS. 2 and 6, it may be understood that the first electrode branch portion 21B is disposed on the first bank 41, and the second bank 42 is disposed on the second bank 42.

In an embodiment, the first bank 41 the second bank 42, and the third bank 43 may be formed substantially in a same process. Thus, in an embodiment, the banks 41, 42, and 43 may constitute a single grid pattern. In an embodiment, each of the plurality of banks 41, 42, and 43 may include polyimide (PI).

Each of the plurality of banks 41, 42, and 43 may have a structure in which at least a portion protrudes from the via layer 20. The banks 41, 42, and 43 may protrude upward from a fiat surface on which the light emitting element 30 is disposed, and at least a part of each of the protruding portions may have a slope. A shape of each of the banks 41, 42, and 43 having the protruding structures is not particularly limited. As shown in the drawing, in an embodiment, the first bank 41 and the second bank 42 protrude to the same height, and the third bank 43 may have a shape protruding to a higher position.

Reflective layers 21a and 22a may be respectively disposed on the first bank 41 and the second bank 42, and electrode layers 21b and 22b may be respectively disposed on the reflective layers 21a and 22a. The reflective layers 21a and 22a and the electrode layers 21b and 22b may constitute the electrodes 21 and 22.

The reflective layers 21a and 22a include a first reflective layer 21a and a second reflective layer 22a. The first reflective layer 21a may cover the first bank 41, and the second reflective layer 22a may cover the second bank 42. Portions of the reflective layers 21a and 22a are electrically connected to the circuit element layer through a contact hole passing through the via layer 20.

Each of the reflective layers 21a and 22a may include a material having high reflectance to reflect light emitted from the light emitting element 30. For example, each of the reflective layers 21a and 22a may include a material such as Ag, Cu, indium tin oxide (ITO), indium zinc oxide (IZO), or indium tin-zinc oxide (ITZO), but the present invention is not limited thereto.

The electrode layers 21b and 22b include a first electrode layer 21b and a second electrode layer 22b. The electrode layers 21b and 22b may have patterns substantially equal to patterns of the reflective layers 21a and 22a. The first reflective layer 21a and the first electrode layer 21b are disposed to be separated from the second reflective layer 22a and the second electrode layer 22b.

Each of the electrode layers 21b and 22b includes a transparent conductive material, and, thus, light emitted from the light emitting element 30 may be incident on the reflective layers 21a and 22a. For example, each of the electrode layers 21b and 22b may include a material such as ITO, IZO or ITZO, but the present invention is not limited thereto.

In some embodiments, the reflective layers 21a and 22a and the electrode layers 21b and 22b may form a structure in which one or more transparent conductive layers such as ITO, IZO, or ITZO, and one or more metal layers such as Ag or Cu are stacked. For example, the reflective layers 21a and 22a and the electrode layers 21b and 22b may form a stacked structure of ITO/Ag/ITO/IZO.

Meanwhile, in some embodiments, the first electrode 21 and the second electrode 22 may be formed as a single layer. That is, the reflective layers 21a and 22a and the electrode layers 21b and 22b may be formed as a single layer to transmit an electrical signal to the light emitting element 30 and, concurrently (e.g., simultaneously), reflect light. For example, each of the first electrode 21 and the second electrode 22 may include a conductive material having high reflectance and may be an alloy containing any of Al, nickel (Ni), and lanthanum (La). However, the present invention is not limited thereto.

The first insulating layer 51 is disposed to partially cover the first electrode 21 and the second electrode 22. The first insulating layer 51 may be disposed to cover most of upper surfaces of the first electrode 21 and the second electrode 22 and may expose portions of the first electrode 21 and the second electrode 22. The first insulating layer 51 may be disposed to partially cover an area in which the first electrode 21 is separated from the second electrode 22 and an area opposite to the area in which the first electrode 21 is separated from the second electrode 22.

The first insulating layer 51 is disposed to expose relatively flat upper surfaces of the first electrode 21 and the second electrode 22 and disposed to allow the electrodes 21 and 22 to overlap inclined surfaces of the first bank 41 and the second bank 42. The first insulating layer 51 forms a flat upper surface to allow the light emitting element 30 to be disposed, and the flat upper surface extends toward the first electrode 21 and the second electrode 22 in a direction. The extension portion of the first insulating layer 51 is terminated at inclined surfaces of the first electrode 21 and the second electrode 22. Thus, the contact electrodes 26 may be in contact with the exposed first electrode 21 and the exposed second electrode 22 and may be in smooth contact with the light emitting element 30 on the flat upper surface of the first insulating layer 51.

The first insulating layer 51 may protect the first electrode 21 and the second electrode 22 and, concurrently (e.g., simultaneously), insulate the first electrode 21 from the second electrode 22. In addition, the first insulating layer 51 may prevent or substantially prevent the light emitting element 30 disposed thereon from being damaged by direct contact with other members.

The light emitting element 30 may be disposed on the first insulating layer 51. At least one light emitting element 30 may be disposed on the first insulating layer 51 between the first electrode 21 and the second electrode 22. In an embodiment, the light emitting element 30 may include a plurality of layers disposed in a direction horizontal to the via layer 20.

The light emitting element 30 of the display device 1 according to one embodiment may include the conductive semiconductors and the active layer, which are described above, and the conductive semiconductors and the active layer may be sequentially disposed on the via layer 20 in the transverse direction. As shown in the drawing, in the light emitting element 30, a first conductivity type semiconductor 31, an active layer 33, a second conductivity type semiconductor 32, and a conductive electrode layer 37 may be sequentially disposed on the via layer 20 in the horizontal direction. However, the present invention is not limited thereto. The order of the plurality of layers disposed in the light emitting element 30 may be the opposite. In some cases, when the light emitting element 30 has another structure, the plurality of layers may be disposed in a direction perpendicular to the via layer 20.

The second insulating layer 52 may be partially disposed on the light emitting element 30. The second insulating layer 52 may protect the light emitting element 30 and, concurrently (e.g., simultaneously), perform a function of fixing the light emitting element 30 during a process of manufacturing the display device 1. The second insulating layer 52 may be disposed to surround an outer surface of the light emitting element 30. That is, a portion of a material of the second insulating layer 52 may be disposed between a bottom surface of the light emitting element 30 and the first insulating layer 51. The second insulating layer 52 may extend between the first electrode branch portion 21B and the second electrode branch portion 22B in the second direction D2 to have an island shape or a linear shape when viewed in a plan view.

The contact electrodes 26 are disposed on the electrodes 21 and 22 and the second insulating layer 52. The first contact electrode 26a and the second contact electrode 26b are disposed to be spaced apart from each other on the second insulating layer 52. Thus, the second insulating layer 52 may insulate the first contact electrode 26a from the second contact electrode 26b.

The first contact electrode 26a may be in contact with at least the first electrode 21, which is exposed due to patterning of the first insulating layer 51, and at least a first end portion of the light emitting element 30. The second contact electrode 26b may be in contact with at least the second electrode 22, which is exposed due to the patterning of the first insulating layer 51, and at least a second end portion of the light emitting element 30. The first and second contact electrodes 26a and 26b may be in contact with side surfaces of the two end portions of the light emitting element 30, for example, the first conductivity type semiconductor 31, the second conductivity type semiconductor 32, or the conductive electrode layer 37. As described above, the first insulating layer 51 forms the flat upper surface such that the contact electrodes 26 may be in smooth contact with the side surfaces of the light emitting element 30.

The contact electrode 26 may include a conductive material. For example, the contact electrode 26 may include ITO, IZO, ITZO, Al, or the like. However, the present invention is not limited thereto.

Each of the first insulating layer 51 and the second insulating layer 52, which are described above, may include an inorganic insulating material or an organic insulating material. In an embodiment, the first insulating layer 51 may include a material such as silicon oxide ($SiO_x$), silicon nitride ($SiN_x$), silicon oxynitride ($SiO_xN_y$), aluminum oxide ($Al_2O_3$), aluminum nitride (AlN), or the Ike. In an embodiment, the second insulating layer 52 may be made of an organic insulating material including a photoresist or the like. However, the present invention is not limited thereto.

The protective layer 80 may be formed to cover (e.g., entirely cover) the display element layer 1a by including the contact electrode 26 and the second insulating layer 52. The light emission pattern 85P of the protective layer 80 may protect the display element layer 1a from the outside and, concurrently (e.g., simultaneously), provide a propagation of the light emitted from the light emitting element 30 to be directed to the upper portion of the display device 1. A description of the protective layer 80 is the same as the above description, and a further detailed description thereof will be omitted herein.

In an embodiment, the light emitting element 30 may include a semiconductor crystal to emit light of a specific wavelength range. The light emitting element 30 may emit light toward the upper portion of the display element layer 1a, and the light emitted from the light emitting element 30 may be visually recognized from the outside of the display device 1 through the protective layer 80.

Figure 7:
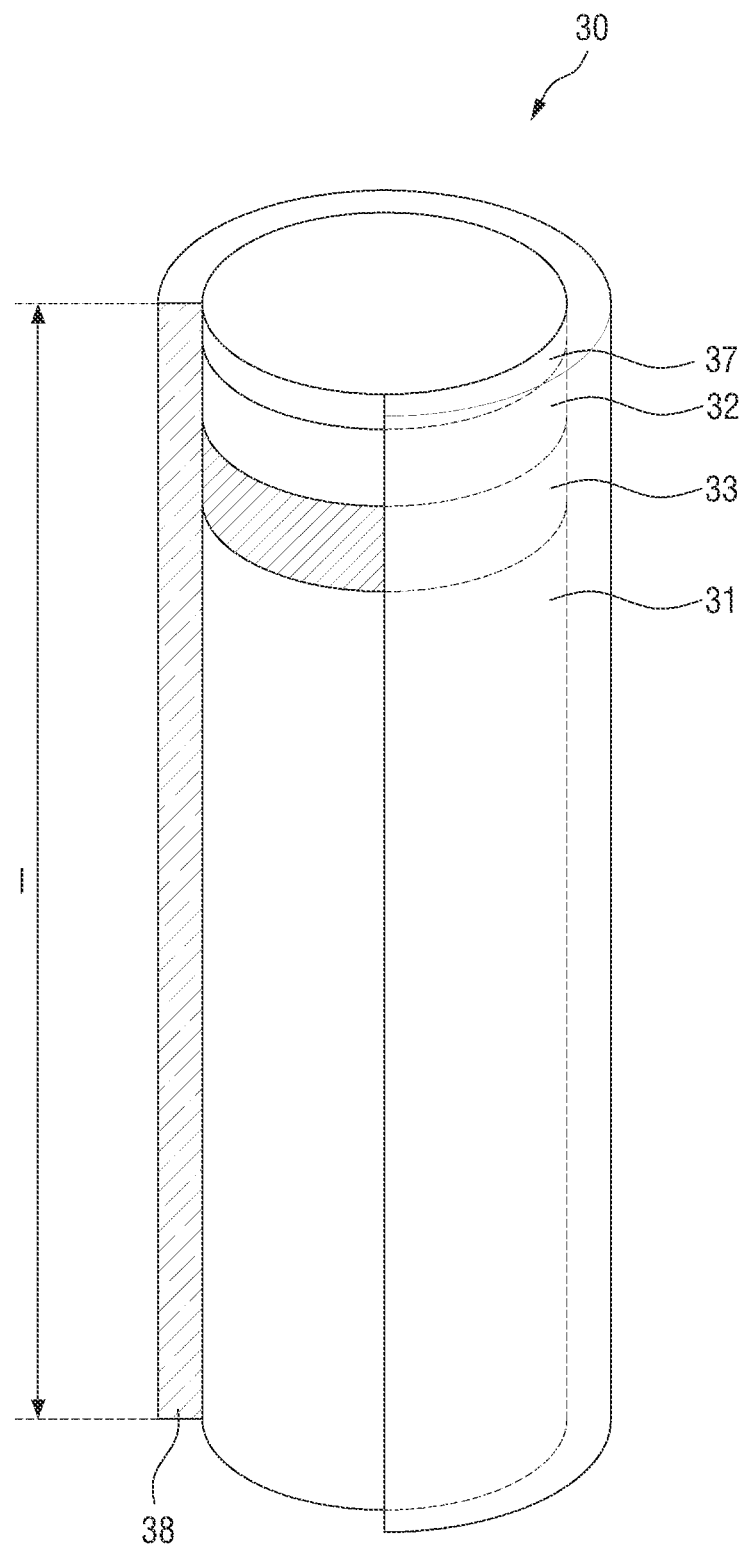
FIG. 7 is a schematic diagram illustrating a light emitting element according to one embodiment.

FIG. 7 is a schematic diagram illustrating a light emitting element according to one embodiment.

In an embodiment, the light emitting element 30 may be a light emitting diode (LED). In an embodiment, the light emitting element 30 may be an inorganic LED having a micrometer unit or nanometer unit size and made of an inorganic material. The inorganic light emitting diode may be aligned between two electrodes in which polarity is formed by forming an electric field in a specific direction between the two electrodes facing each other. The light emitting element 30 may be aligned between two electrodes due to an electric field formed on the two electrodes.

The light emitting element 30 may include a semiconductor crystal doped with an arbitrary conductivity type (e.g., p-type or n-type) impurity. The semiconductor crystal may receive an electrical signal applied from an external power source and emit light in a specific wavelength range.

Referring to FIG. 7, the light emitting element 30 according to one embodiment may include a first conductivity type semiconductor 31, a second conductivity type semiconductor 32, an active layer 33, and an insulating film 38. In addition, the light emitting element 30 according to one embodiment may further include at least one conductive electrode layer 37. Although the light emitting element 30 has been illustrated as including one conductive electrode layer 37 in FIG. 7, the present invention is not limited thereto. In some cases, the light emitting element 30 may include a greater number of conductive electrode layers 37 or the conductive electrode layer 37 may be omitted. A description of the light emitting element 30, which will be made below, may be applied even when the number of conductive electrode layers 37 is varied or another structure is further included.

The light emitting element 30 may have a shape extending in a first direction. The light emitting element 30 may have a shape of a nanorod, nanowire, nanotube, or the Ike. In an embodiment, the light emitting element 30 may have a cylindrical shape or a rod shape. However, the shape of the light emitting element 30 is not limited thereto and may have any of various shapes such as a regular hexahedral shape, a rectangular parallelepiped shape, a hexagonal column shape, and the like. A plurality of semiconductors included in the light emitting element 30, which will be described below, may have a structure in which the semiconductors are sequentially disposed or stacked in the first direction.

The light emitting element 30 according to one embodiment may emit light in a specific wavelength range. In an example, the active layer 33 may emit blue light having a central wavelength range ranging from 450 nm to 495 nm. However, the central wavelength range of the blue light is not limited to the above range, and it should be understood that the central wavelength range includes all wavelength ranges which can be recognized as a blue color in the art. In addition, the light emitted from the active layer 33 of the light emitting element 30 is not limited thereto, and the light may be green light having a central wavelength range ranging from 495 nm to 570 nm or red light having a central wavelength range ranging from 620 nm to 750 nm.

To describe the light emitting element 30 in further detail with reference to FIG. 7, the first conductivity type semiconductor 31 may be an n-type semiconductor having, for example, a first conductivity type. For example, when the light emitting element 30 emits light in a blue wavelength range, the first conductivity type semiconductor 31 may include a semiconductor material having a chemical formula of $In_xAl_yGa_{1-x-y}N$ ($0 \le x \le 1$, $0 \le y \le 1$, and $0 \le x+y \le 1$). For example, the semiconductor material may be one or more among InAlGaN, GaN, AlGaN, InGaN, AlN, and InN which are doped with an n-type impurity. The first conductivity type semiconductor 31 may be doped with a first conductive dopant. For example, the first conductive dopant may be Si, Ge, Sn, or the like. In an example, the first conductivity type semiconductor 31 may be n-GaN doped with n-type Si. A length of the first conductivity type semiconductor 31 may be in a range from 1.5 μm to 5 μm, but the present invention is not limited thereto.

The second conductivity type semiconductor 32 is disposed on the active layer 33 which will be described below. For example, the second conductivity type semiconductor 32 may be a p-type semiconductor having a second conductivity type. For example, when the light emitting element 30 emits light in a blue or green wavelength range, the second conductivity type semiconductor 32 may include a semiconductor material having a chemical formula of $In_xAl_yGa_{1-x-y}N$ ($0 \le x \le 1$, $0 \le y \le 1$, and $0 \le x+y \le 1$). For example, the semiconductor material may be one or more among InAlGaN, GaN, AlGaNN, InGaN, AlN, and InN which are doped with an n-type impurity. The second conductivity type semiconductor 32 may be doped with a second conductive dopant. For example, the second conductive dopant may be Mg, Zn, Ca, Se, Ba, or the like. In an example, the second conductivity type semiconductor 32 may be p-GaN doped with p-type Mg. A length of the second conductivity type semiconductor 32 may be in a range from 0.08 μm to 0.25 μm, but the present invention is not limited thereto.

Meanwhile, in the drawing, although each of the first conductivity type semiconductor 31 and the second conductivity type semiconductor 32 has been illustrated as being formed as one layer, the present invention is not limited thereto. In some cases, each of the first conductivity type semiconductor 31 and the second conductivity type semiconductor 32 may further include a larger number of layers, for example, a clad layer or a tensile strain barrier reducing (TSBR) layer according to a material of the active layer 33.

The active layer 33 is disposed between the first conductivity type semiconductor 31 and the second conductivity type semiconductor 32. The active layer 33 may include a material having a single or multiple quantum well structure. When the active layer 33 includes a material having a multiple quantum well structure, the active layer 33 may have a structure in which a plurality of quantum layers and a plurality of well layers are alternately stacked. The active layer 33 may emit light due to a combination of electron-hole pairs in response to an electrical signal applied through the first conductivity type semiconductor 31 and the second conductivity type semiconductor 32. As an example, when the active layer 33 emits light in a blue wavelength range, the active layer 33 may include a material such as AlGaN, AlInGaN, or the like. In particular, when the active layer 33 has a multi-quantum well structure in which quantum layers and well layers are alternately stacked, the quantum layer may include a material such as AlGaN or AlInGaN, and the well layer may include a material such as GaN or AlInN. In an example, the active layer 33 includes AlGaInN as the quantum layer and AlInN as the well layer. As described above, the active layer 33 may emit blue light having a central wavelength range ranging from 450 nm to 495 nm.

However, the present invention is not limited thereto, and the active layer 33 may have a structure in which a semiconductor material having large band gap energy and a semiconductor material having small band gap energy are alternately stacked or include different Group III to V semiconductor materials according to a wavelength range of emitted light. The active layer 33 is not limited to emit light in the blue wavelength range, and, in some cases, the active layer 330 may emit light in a red or green wavelength range. A length of the active layer 33 may be in a range from 0.05 µm to 0.25 µm, but the present invention is not limited thereto.

In an embodiment, the light emitted from the active layer 33 may be emitted to an outer surface of the light emitting element 30 in a length direction and both side surfaces thereof. Directivity of the light emitted from the active layer 33 is not limited in one direction.

In an embodiment, the conductive electrode layer 37 may be an ohmic contact electrode. However, the present invention is not limited thereto, and, in an embodiment, the conductive electrode layer 37 may be a Schottky contact electrode. The conductive electrode layer 37 may include a conductive metal. For example, the conductive electrode layer 37 may include at least one among Al, titanium (Ti), indium (In), gold (Au), silver (Ag), ITO, IZO, and ITZO. In addition, the conductive electrode layer 37 may include a semiconductor material doped with an n-type or p-type impurity. The conductive electrode layer 37 may include the same material or different materials, but the present invention is not limited thereto.

The insulating film 38 is disposed to surround outer surfaces of the plurality of semiconductors which are described above. In an example, the insulating film 38 may be disposed to surround at least the outer surface of the active layer 33 and may extend in a direction in which the light emitting element 30 extends. The insulating film 38 may serve to protect the members. For example, the insulating film 38 may be formed to surround side surfaces of the members and to expose both end portions of the light emitting element 30 in the length direction.

In the drawing, the insulating film 38 has been illustrated as being formed to extend in the length direction of the light emitting element 30 to cover from the first conductivity type semiconductor 31 to the conductive electrode layer 37, but the present invention in not limited thereto. In an embodiment, the insulating film 38 covers only the outer surfaces of some semiconductor layers including the active layer 33 or covers only a portion of the outer surface of the conductive electrode layer 37 such that a portion of the outer surface of the conductive electrode layer 37 may be exposed.

A thickness of the insulating film 38 may be in a range from 10 nm to 1.0 µm, but the present invention is not limited thereto. In an embodiment, the thickness of the insulating film 38 may be 40 nm.

The insulating film 38 may include any of various materials having insulation properties, for example, $SiO_x$, $SiN_x$, $SiO_xN_y$, AlN, $Al_2O_3$, and the like. Thus, it is possible to prevent or substantially prevent an electrical short circuit which may occur when the active layer 33 is in direct contact with an electrode through which an electrical signal is transmitted to the light emitting element 30. In addition, since the insulating film 38 protects the outer surface of the light emitting element 30 including the active layer 33, it is possible to prevent or substantially prevent degradation in light emission efficiency.

In addition, in some embodiments, the outer surface of the insulating film 38 may be surface treated. In an embodiment, when the display device 1 is manufactured, the light emitting element 30 may be sprayed onto an electrode in a state of being dispersed in a predetermined ink. In an embodiment, in order to allow the light emitting element 30 to maintain the dispersed state without being agglomerated with an adjacent another light emitting element 30 in the ink, the insulating film 38 may be hydrophobically or hydrophilically treated.

In an embodiment, the light emitting element 30 may have a length l in a range from 1 µm to 10 µm or from 2 µm to 5 µm, and, in an embodiment, the length l may be about 4 µm. Further, in an embodiment, a diameter of the light emitting element 30 may be in a range from 30 nm to 700 nm, and an aspect ratio of the light emitting element 30 may be in a range from 1.2 to 100. However, the present invention is not limited thereto, and the plurality of light emitting elements 30 included in the display device 1 may have different diameters according to a difference in composition of the active layers 33. In an embodiment, the diameter of the light emitting element 30 may be about 500 nm.

Hereinafter, a method of manufacturing the display device 1 according to one embodiment will be described.

Figure 8:
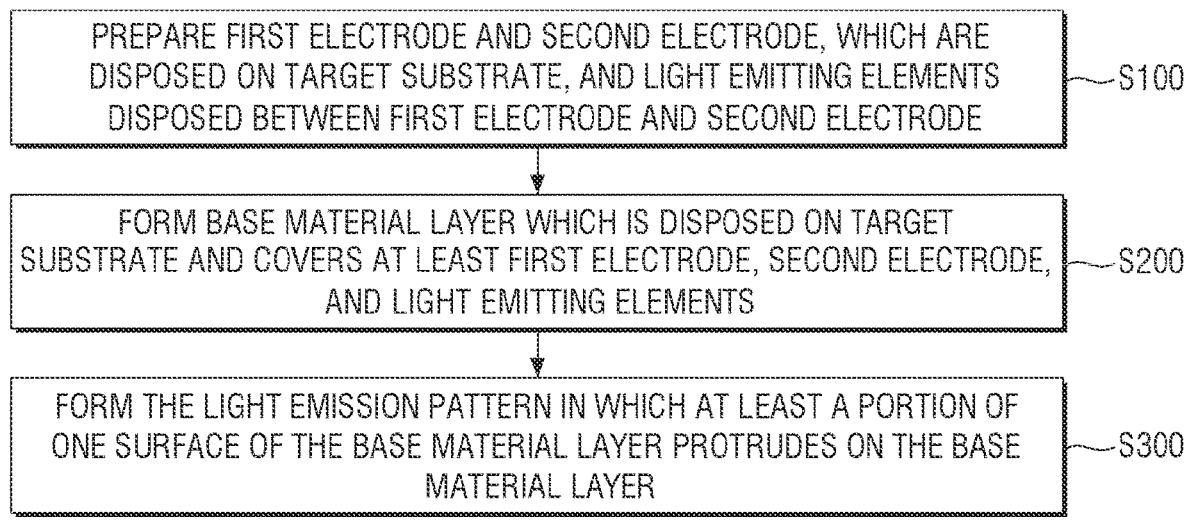
FIG. 8 is a flowchart illustrating a method of manufacturing a display device according to one embodiment.

FIG. 8 is a flowchart illustrating a method of manufacturing a display device according to one embodiment.

Referring to FIG. 8, a method of manufacturing the display device 1 includes preparing the first electrode 21 and the second electrode 22, which are disposed on the target substrate SUB, and the light emitting elements 30 disposed between the first electrode 21 and the second electrode 22 (S100), forming the base material layer 81 which is disposed on the target substrate SUB and at least covers the first electrode 21, the second electrode 22, and the light emitting elements 30 (S200), and forming the light emission pattern 85P in which at least a portion of one surface of the base material layer 81 protrudes on the base material layer 81 (S300).

The display device 1 according to one embodiment may be manufactured such that the display element layer 1a on which the light emitting elements 30 are disposed is prepared, and the protective layer 80 covering the display element layer 1a is formed. The protective layer 80 may be manufactured such that a base material layer 81' constituting the base material layer 81 is formed and then the light emission pattern 85P is formed on the base material layer 81'.

FIGS. 9 to 12 are schematic diagrams illustrating the method of manufacturing a display device according to one embodiment.

Figure 9:
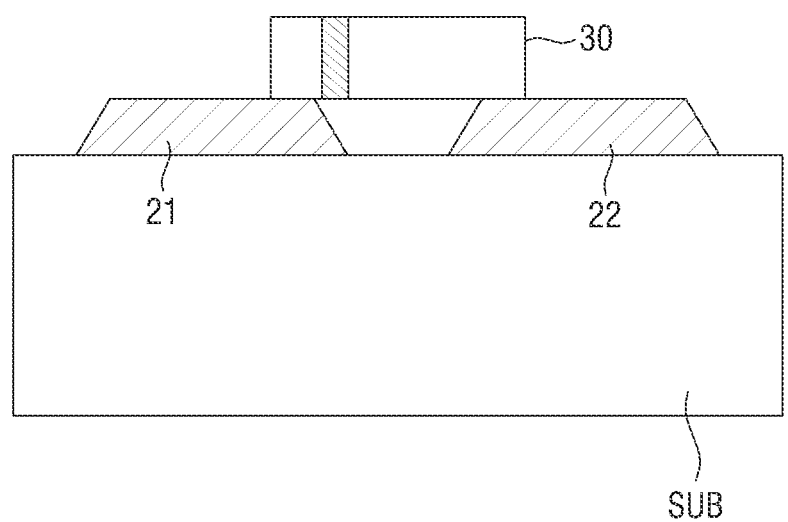
FIGS. 9 to 12 are cross-sectional views illustrating a method of manufacturing a display device according to one embodiment.

First, as shown in FIG. 9, the target substrate SUB on which the first electrode 21 and the second electrode 22 are formed is prepared, and the light emitting element 30 is disposed on the first electrode 21 and the second electrode 22 (S100). For convenience of description, in the following drawings, the electrodes 21 and 22 and the light emitting elements 30 are only illustrated on the display element layer 1a. However, the display device 1 is not limited thereto, and, as described above, the display device 1 may include more members such as the bank, the contact electrode 26, and the like.

In an embodiment, the light emitting element 30 may be disposed on the electrodes 21 and 22 using dielectrophoresis (DEP). The solution in which the light emitting elements 30 are dispersed is sprayed onto the electrodes 21 and 22, and alternating-current (AC) power is applied to the electrodes 21 and 22. When the AC power is applied to the first electrode 21 and the second electrode 22, an electric field is generated between the first electrode 21 and the second electrode 22, and the light emitting element 30 receiving a dielectrophoretic force due to the electric field may be disposed on the electrodes 21 and 22. A further detailed description thereof will be omitted.

Figure 10:
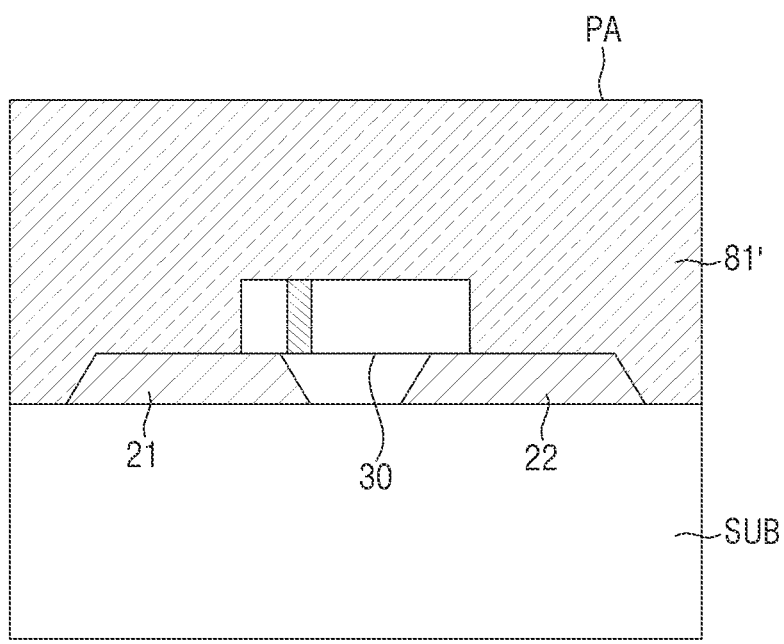

Next, as shown in FIG. 10, the base material layer 81' disposed on the target substrate SUB is formed (S200). The base material layer 81' may be disposed to cover at least the first electrode 21, the second electrode 22, and the light emitting element 30. In the drawings, the base material layer 81' has been illustrated as entirely covering the upper surface of the target substrate SUB, but the present invention is not limited thereto.

The surface PA facing the target substrate SUB may be formed in the base material layer 81', and, in an operation which will be described below, the light emission pattern 85P may be formed on the surface PA to constitute the base material layer 81 of the protective layer 80. The base material layer 81' may include a material in a state in which the base material layer 81 is not cured and may include substantially the same material as the base material layer 81.

In an example, the base material layer 81' may include substantially the same material as the base material layer 81 and may be in an uncured semi-solid state. For example, the base material layer 81' may be in a solution state in which a polymer matrix constituting the base material layer 81 is not cured. In addition, in some cases, the base material layer 81' may further include a material with which the polymer matrix is cured and which is necessary for forming the base material layer 81. For example, when the base material layer 81 includes a photocurable polymer, the base material layer 81' may further include an uncured polymer, a photo-initiator, a crosslinking agent, an additive, and the like.

Meanwhile, even when the light emission pattern 85P is formed, a thickness of the base material layer 81' may have a range in which the light emitting element 30 of the display element layer 1a is not damaged. For example, the base material layer 81' may be formed to have a thickness in a range from 1 μm to 10 mm based on the highest point at which a height difference of the display element layer 1a is formed to be high. However, the present invention is not limited thereto.

Next, as shown in FIG. 11, the light emission pattern 85P is formed on the base material layer 81' using a mold MOLD (S300). In an example, the formation of the light emission pattern 85P may include pressing and molding a surface PA of the base material layer 81' using a mold MOLD having a surface in which some region is depressed. As shown in the drawing, at least a partial region of a lower surface of the mold MOLD may have a shape in which at least a portion thereof is depressed. In an embodiment, the partial region of the lower surface of the mold MOLD may be concavely depressed to have a curved shape. However, the depressed shape may be varied according to the light emission pattern 85P of the protective layer 80, and the shape of the mold MOLD is not limited to the shape of FIG. 11. The shape of the mold MOLD may have a shape inverse to the shape of the protrusion 85 of the light emission pattern 85P of the protective layer 80.

The base material layer 81' is disposed on the target substrate SUB in a state in which a material constituting the base material layer 81 is not cured. When the surface PA of the base material layer 81' is pressed using the mold MOLD, the light emission pattern 85P may be formed on the surface PA of the base material layer 81' according to the depressed shape formed on the lower surface of the mold MOLD. The light emission pattern 85P may include a plurality of protrusions 85 of which at least some region protrudes.

Figure 12:
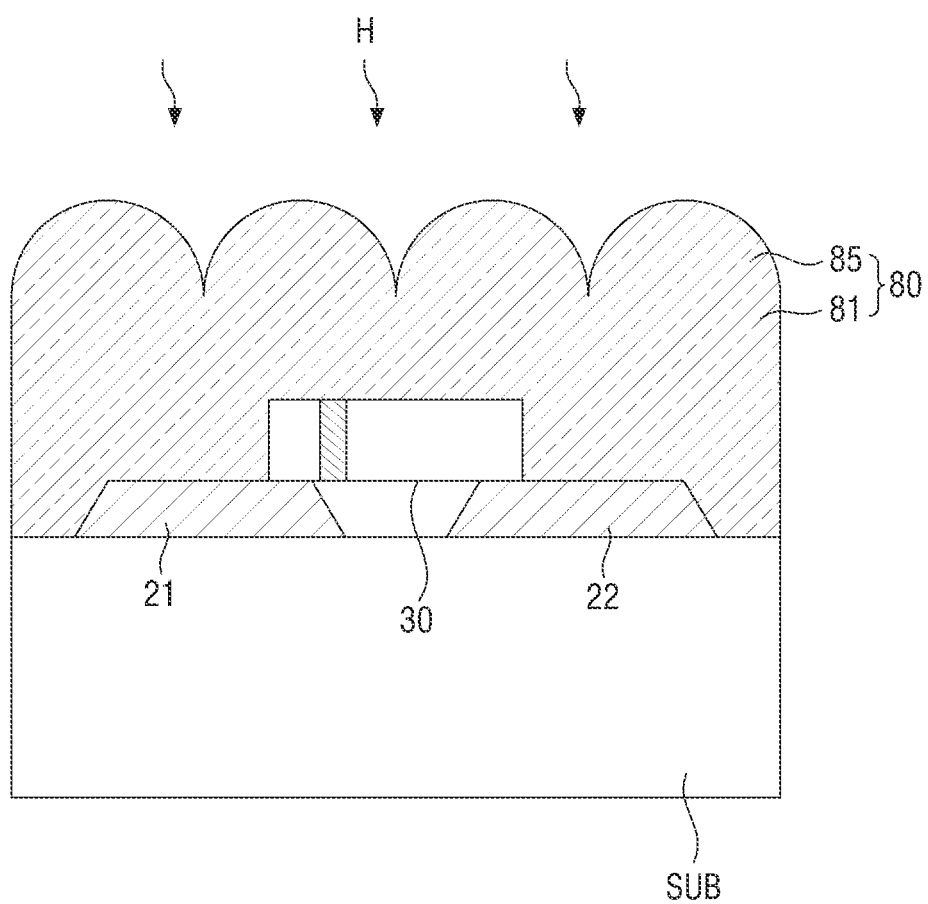

Finally, as shown in FIG. 12, the mold MOLD is removed and the base material layer 81' is cured to form the protective layer 80 including the base material layer 81 and the light emission pattern 85P. In the drawing, it is shown that the base material layer 81' is heated using heat H and cured to form the base material layer 81. However, the present invention is not limited thereto, and, as described above, when the base material layer 81 includes a photocurable polymer, the base material layer 81' may be irradiated with light to be cured. Through the above described method, the protective layer 80 of the display device 1 may be formed.

Meanwhile, as described above, the shape of the light emission pattern 85P of the protective layer 80 is not limited to the shapes in FIGS. 1 and 3. The light emission pattern 85P may have a shape in which a surface thereof is inclined or has a spherical shape. Hereinafter, another embodiment of the display device 1 will be described.

Figure 13:
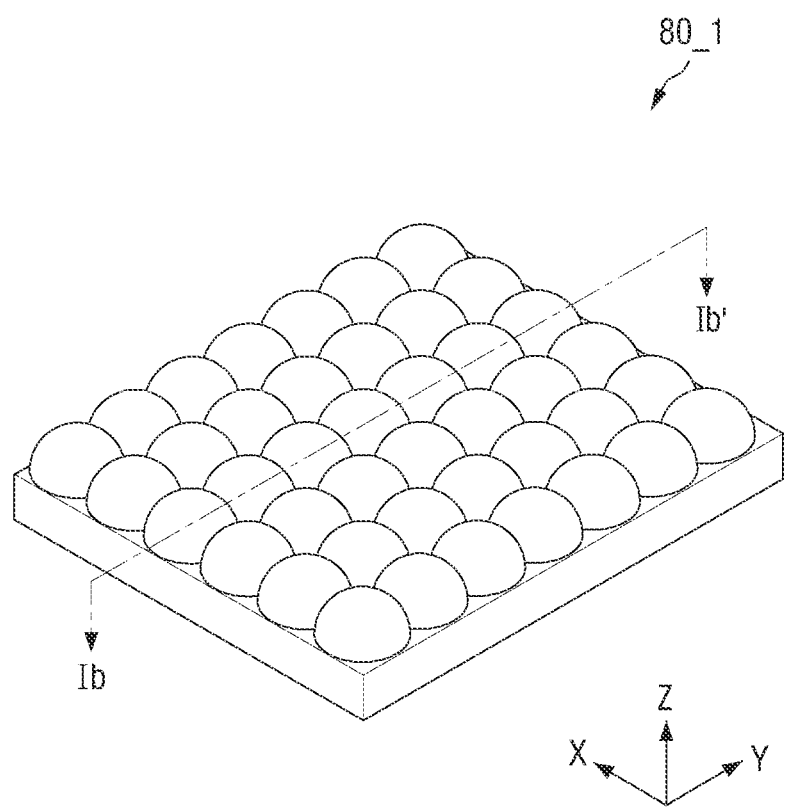
FIG. 13 is a schematic cross-sectional view illustrating a protective layer according to one embodiment.
Figure 14:
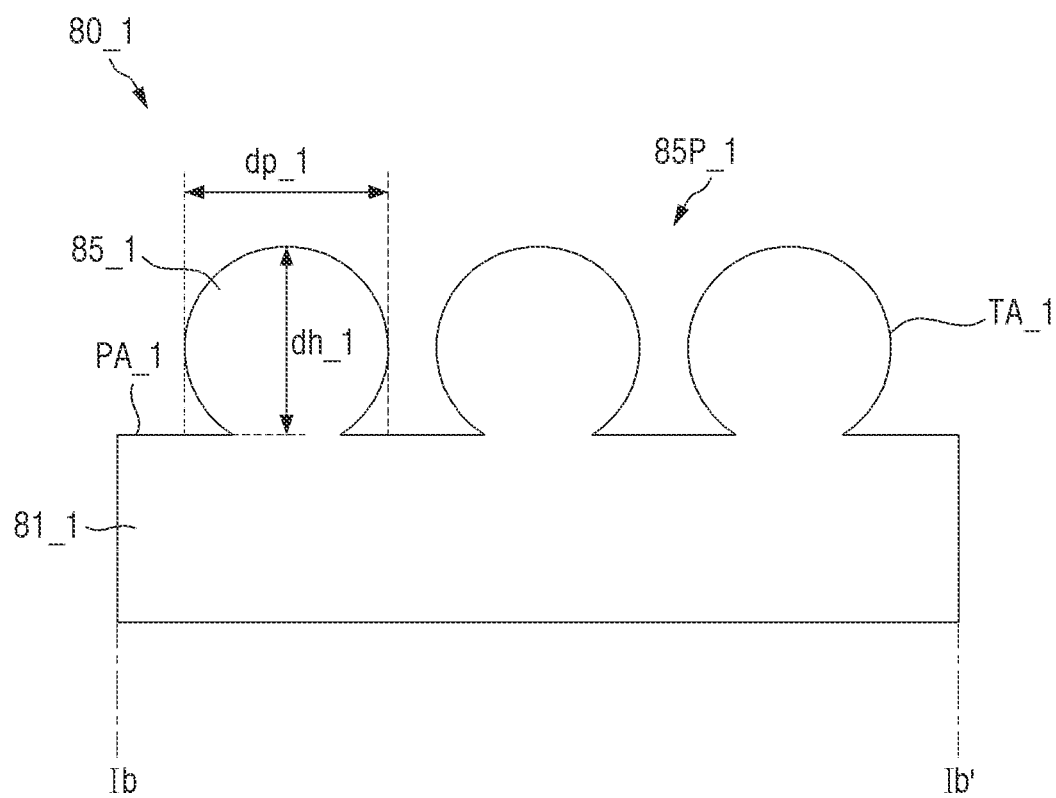
FIG. 14 is a cross-sectional view taken along line Ib-Ib' of FIG. 13.

FIG. 13 is a schematic cross-sectional view illustrating a protective layer according to one embodiment; and FIG. 14 is a cross-sectional view taken along line Ib-Ib' of FIG. 13.

A protective layer 80_1 according to one embodiment includes a light emission pattern disposed on a base material layer 81_1, and the light emission pattern includes a protrusion 85_1 in which at least a portion of a surface PA_1 of the base material layer 81_1 protrudes. The protrusion 85_1 may form a spherical-shaped, or substantially spherical-shaped, and an outer surface TA_1 which is rounded with a curvature (e.g., a predetermined curvature). Unlike the protective layer 80 of FIG. 1, in the protective layer 80_1 of FIG. 13, the protrusion 85_1 of the light emission pattern may not extend in one direction and may form a spherical-shaped unit body. That is, in the protective layer 80_1 according to one embodiment, the light emission pattern may have a micro-lens shape. The protective layer 80_1 of FIGS. 13 and 14 may be the same as the protective layer 80 of FIGS. 1 and 3, except for the protrusion 85_1 of the light emission pattern having a different shape.

The protrusion 85_1 of FIG. 14 may form the outer surface TA_1 which is substantially the same as that of FIG. 3 but may have a shape dose to a spherical shape when compared to FIG. 3. In an embodiment, when the protrusion 85_1 has a spherical shape, a height dh_1 of the outer surface TA_1 may be in a range of 10 μm to 50 μm, and a diameter dp_1 thereof may be in a range of 20 μm to 100 μm. When the height dh_1 of the outer surface TA_1 deviates from the above described range, light emission efficiency of the light emitted from a light emitting element 30 is decreased or a Moire phenomenon occurs, and, in some cases, electrodes 21 and 22 of the display element layer 1a may be visually recognized from the outside. In addition, when the diameter dp_1 of the outer surface TA_1 is less than or equal to 20 μm, a range of an effective incident angle, in which light incident from the light emitting element 30, for example, the second light EL2 (see FIG. 4), is not reflected from the protrusion 85_1, may be decreased. The protective layer 80_1 according to one embodiment may include the protrusion 85_1 having a size within the above-described range, and, thus, a ratio of the light emitted from the light emitting element 30 to the light propagating an upper portion of the protective layer 80_1 may be maximized or increased.

Figure 15:
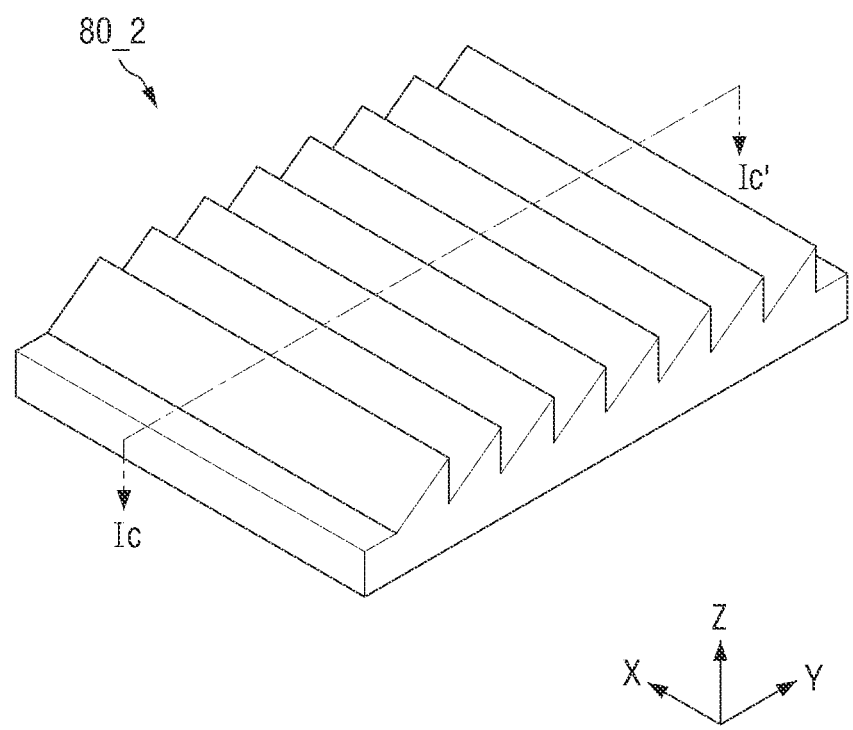
FIG. 15 is a schematic cross-sectional view illustrating a protective layer according to one embodiment.
Figure 16:
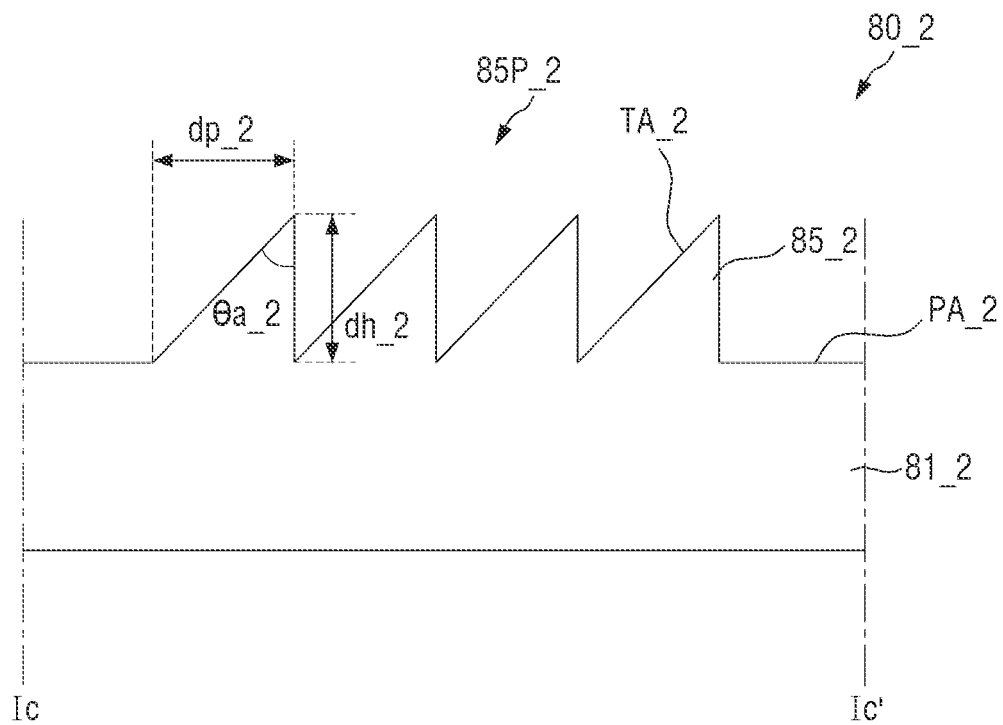
FIG. 16 is a cross-sectional view taken along line Ic-Ic' of FIG. 15.

FIG. 15 is a schematic cross-sectional view illustrating a protective layer according to one embodiment; and FIG. 16 is a cross-sectional view taken along line Ic-Ic' of FIG. 15.

Referring to FIGS. 15 and 16, a protrusion 85_2 may form an outer surface TA_2 which is formed to be inclined from a surface PA_2 of a base material layer 81_2. Unlike the protective layer 80 of FIG. 1, in a protective layer 80_2 of FIG. 15, the protrusion 85_2 of a light emission pattern may form a linear-shaped outer surface TA_2 without being curved. The protective layer 80_2 according to one embodiment may have a prism shape such that a cross-section of the light emission pattern is obliquely formed at an angle (e.g., a predetermined angle). The protective layer 80_2 of FIGS. 15 and 16 may be the same as the protective layer 80 of FIGS. 1 and 3, except for the protrusion 85_2 of the light emission pattern 85P_2 having a different shape.

In the protrusion 85_2 of FIG. 15, the outer surface TA_2 may be formed in a linear shape which is inclined at an angle (e.g., a predetermined angle) and may have a triangular shape in a cross-sectional view. In the drawings, one side of a cross-section of the protrusion 85_2 has been illustrated as being perpendicular to the surface PA_2 of the base material layer 81_2 and the other side thereof has been illustrated as an inclined shape, but the present invention is not limited thereto. In an embodiment, the two sides of the outer surface TA_2 of the protrusion 85_2 may be formed to be inclined to the surface PA_2 of the base material layer 81_2.

In an embodiment, when the outer surface TA_2 of the protrusion 85_2 is inclined and has a polygonal shape, a height dh_2 of the outer surface TA_2 may be in a range of 10 μm to 50 μm, and a diameter dp_2 thereof may be in a range of 20 μm to 100 μm. In an embodiment, an angle θa_2 at a point of the outer surface TA_2 of the protrusion 85_2 opposite to the surface PA_2 of the base material layer 81_2 may be in a range of 60° to 120° or 80° to 110°. However, the present invention is not limited thereto. Since descriptions of the height, the diameter, and the like of the protrusion 85_2 are the same as described with reference to other embodiments, further detailed descriptions thereof will be omitted herein.

According to another embodiment, a protective layer may further include a bead (shown in FIG. 19) which scatters light, and a light emission pattern may be formed such that the bead included in the protective layer is exposed on the base material layer. That is, during the manufacturing of the protective layer, the light emission pattern may not be formed by pressing a mold but may be formed using the bead.

Figure 17:
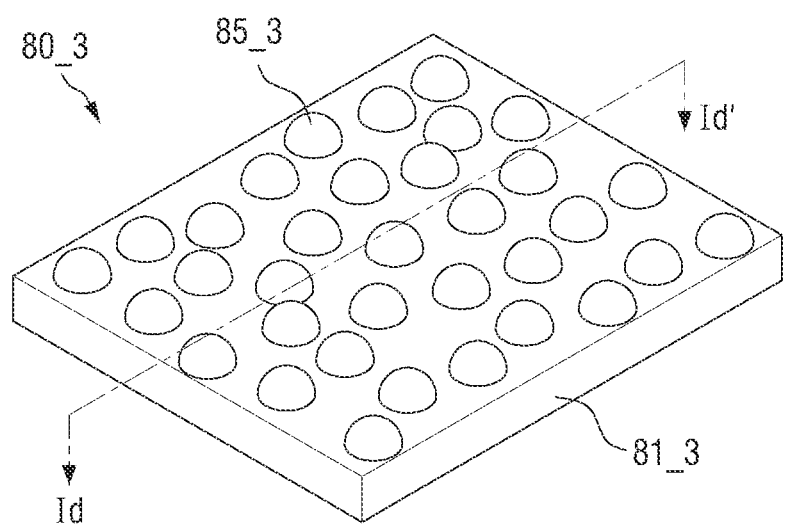
FIG. 17 is a schematic cross-sectional view illustrating a protective layer including a bead according to one embodiment.
Figure 18:
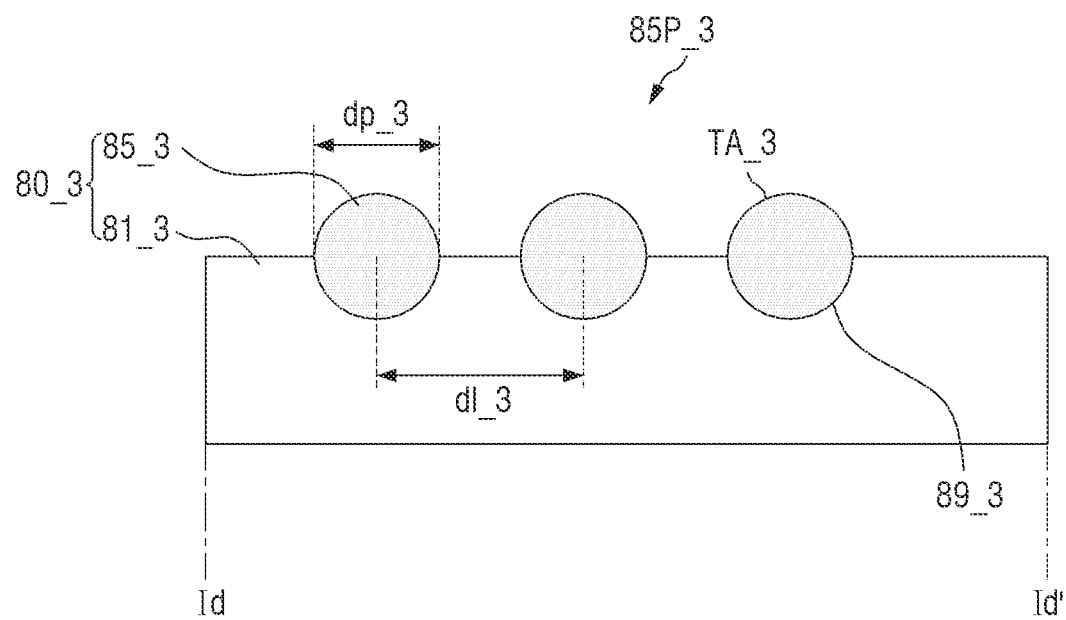
FIG. 18 is a cross-sectional view taken along line Id-Id' of FIG. 17.

FIG. 17 is a schematic cross-sectional view illustrating a protective layer including a bead according to one embodiment; and FIG. 18 is a cross-sectional view taken along line Id-Id' of FIG. 17.

Referring to FIGS. 17 and 18, a protective layer 80_3 according to one embodiment further includes at least one bead 89_3 disposed on a base material layer 81_3, and a light emission pattern 85P_3 may be formed such that at least one bead 89_3 is disposed on the base material layer 81_3. The protective layer 80_3 may include a plurality of beads 89_3, and the beads 89_3 may be disposed to be spaced apart from each other on the base material layer 81_3.

At least a partial region of the bead 89_3 may be exposed on a surface PA_3 of the base material layer 81_3. Unlike FIG. 1, the protective layer 80_3 of FIG. 17 may be formed without using the mold MOLD having the inverted shape of the protrusion 85 such that the bead 89_3 included in the base material layer 81_3 is partially exposed on the one surface PA_3. Thus, the light emission pattern 85P_3 of the protective layer 80_3 may include a protrusion 85_3 having a shape similar to FIG. 13, and the protrusion 85_3 may include the bead 89_3 made of a material different from the material of the base material layer 81_3.

In an example, the plurality of beads 89_3 may have a diameter dp_3 in a range from 0.1 μm to 100 μm, and a separation distance dl_3 between the plurality of beads 89_3 may be greater than or equal to 1 μm. However, the present invention is not limited thereto.

Meanwhile, the bead 89_3 according to one embodiment may include a material which scatters incident light.

Figure 19:
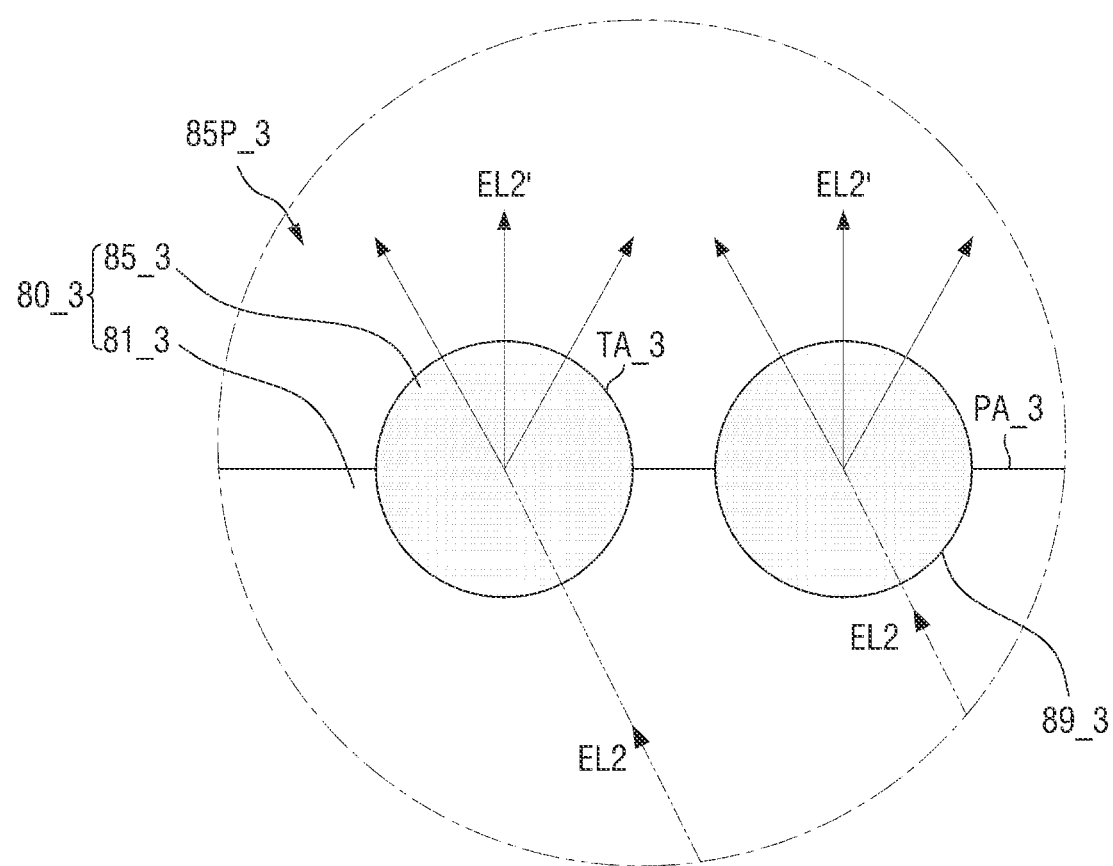
FIG. 19 is a schematic diagram illustrating that light is incident on the protective layer according to one embodiment.

FIG. 19 is a schematic diagram illustrating that light is incident on the protective layer according to one embodiment.

Referring to FIG. 19, second light EL2 emitted from a light emitting element 30 and directed to the light emission pattern 85P_3 of the protective layer 80_3 may be incident on the bead 89_3. In an embodiment, the bead 89_3 may include scattering particles which scatter incident light and scatter the incident second light EL2 to emit scattered second light EL2' of FIG. 19 toward an upper surface of the protective layer 80_3. Thus, the bead 89_3 may provide a propagation path of the light emitted from the light emitting element 30 and, concurrently (e.g., simultaneously), scatter the incident light to improve the top emission efficiency of the display device 1.

In an example, the bead 89_3 may include an organic material or an inorganic material. For example, when the bead 89_3 includes an organic material, the organic material may be at least any one among an acrylic-based, styrene-based, formaldehyde-based, propylene-based, ethylene-based, silicone-based, urethane-based, methyl methacrylate-based, and polycarbonate-based polymers or copolymers. When the bead 89_3 includes an inorganic material, the inorganic material may be at least any one among silica, zirconia, calcium carbonate, barium sulfate, and titanium oxide. However, the present invention is not limited thereto.

Figure 20:
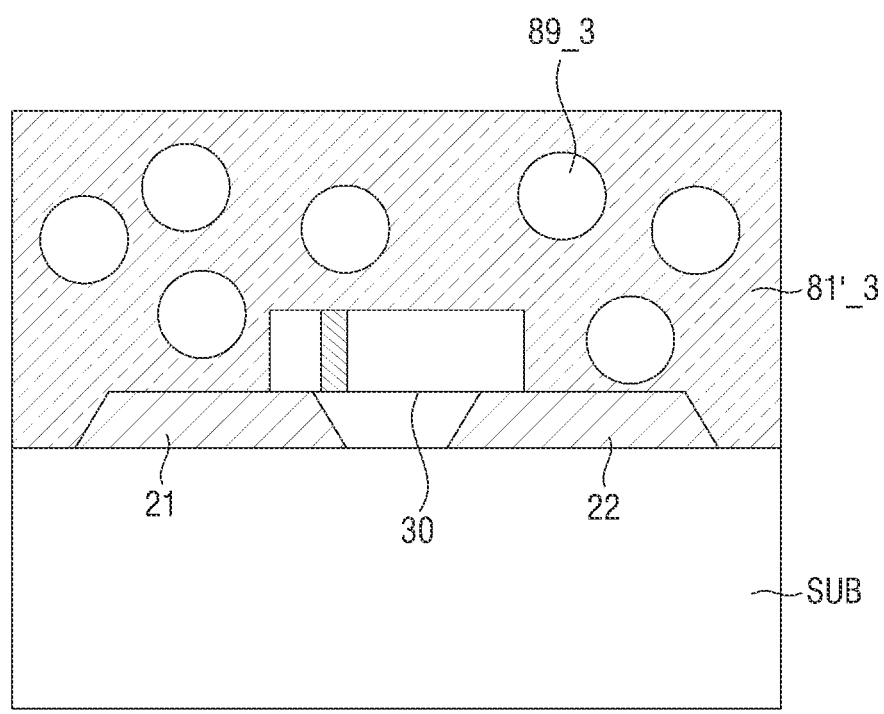
FIGS. 20 and 21 are schematic diagrams illustrating a method of manufacturing the protective layer of FIG. 17.
Figure 21:
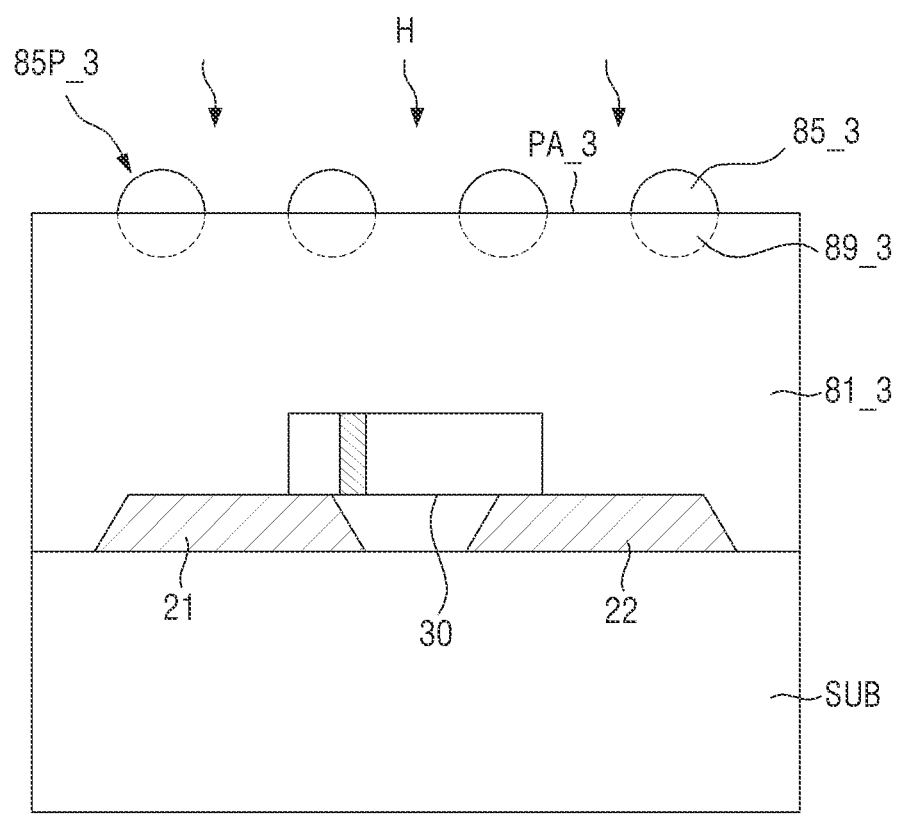

FIGS. 20 and 21 are schematic diagrams illustrating a method of manufacturing the protective layer of FIG. 17.

Referring to FIGS. 20 and 21, during manufacturing of the protective layer 80_3, in the formation of a base material layer 81'_3 (S200), the base material layer 81'_3 may further include the beads 89_3. The plurality of beads 89_3 may be included in the base material layer 81'_3 to be maintained in a dispersed state.

Thereafter, in the formation of the base material layer 81_3 by curing the base material layer 81'_3, at least a partial region of the bead 89_3 may be exposed on the surface PA_3 of the base material layer 81_3, and the exposed bead 89_3 may form the light emission pattern 85P_3 of the protective layer 80_3. Thus, without using a separate mold MOLD, the protective layer 80_3 including the bead 89_3 may form the light emission pattern 85P_3 on the surface PA_3 of the base material layer 81_3.

Meanwhile, FIG. 18 illustrates that at least a partial region of the bead 89_3 is exposed on the base material layer 81_3 and a remaining region thereof is disposed in the base material layer 81_3. However, the present invention is not limited thereto, and, in an embodiment, the entire region, or substantially the entire region, of the bead 89_3 may be exposed to be disposed on the surface PA_3 of the base material layer 81_3.

Figure 22:
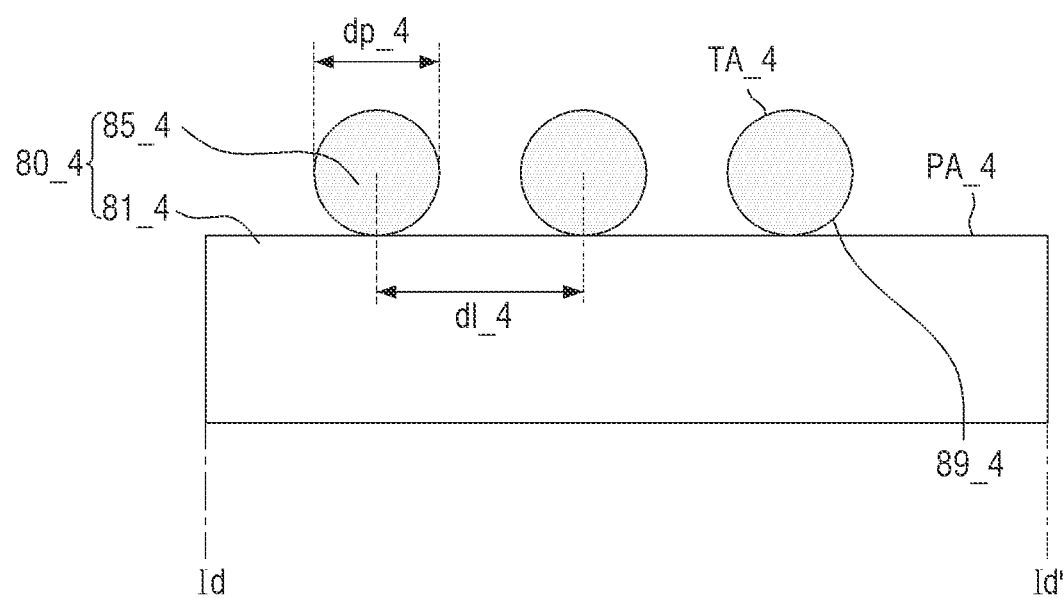
FIG. 22 is a cross-sectional view taken along line Id-Id' of FIG. 17 according to one embodiment.

FIG. 22 is a cross-sectional view taken along line Id-Id' of FIG. 17 according to one embodiment.

Referring to FIG. 22, according to one embodiment, a bead 89_4 of a protective layer 80_4 may be disposed on a surface of a base material layer 81_4. In an operation of curing the base material layer 81'_3, the bead 89_4 may be completely, or substantially completely, exposed from the base material layer 81_4, such as by controlling a process time and a temperature. A partial region of the bead 89_4 is not impregnated in the base material layer 81_4 and the entire region thereof is exposed to the outside such that a protrusion 85_4 having a shape which is substantially the same as that shown in FIG. 13 may be formed. However, in the case of FIG. 22, since the bead 89_4 including scattering particles is disposed on the surface of the base material layer 81_4, incident light may be scattered. A duplicate description thereof will be omitted herein.

In an embodiment, the display device 1 may further include a light emitting element having a structure different from the structure of the light emitting element 30 of FIG. 7.

FIG. 23 is a schematic diagram of a light emitting element according to one embodiment.

Referring to FIG. 23, a light emitting element 30' may be formed such that a plurality of layers are not stacked in one direction and each of the plurality of layers surrounds an outer surface of another layer. The light emitting element 30' of FIG. 23 is the same as the light emitting element 30 of FIG. 7 except that shapes of the layers are partially different from each other. Hereinafter, repeated descriptions will be omitted and differences will be described.

According to one embodiment, a first conductivity type semiconductor 31' may extend in a direction and both end portions thereof may be formed to be inclined toward a central portion thereof. The first conductivity type semiconductor 31' of FIG. 23 may have a shape in which a rod-shaped or cylindrical main body and conical-shaped end portions on upper and lower portions of the main body are formed. In an embodiment, an upper end portion of the main body may have a slope that is steeper than a slope of a lower end portion thereof.

An active layer 33' is disposed to surround an outer surface of the main body of the first conductivity type semiconductor 31'. The active layer 33' may have an annular shape extending in a direction. In an embodiment, the active layer 33' may not be formed on upper and lower end portions of the first conductivity type semiconductor 31'. That is, the active layer 33' may be in contact with only a parallel side surface of the first conductivity type semiconductor 31'.

A second conductivity type semiconductor 32' is disposed to surround an outer surface of the active layer 33' and the upper end portion of the first conductivity type semiconductor 31'. The second conductivity type semiconductor 32' may include an annular-shaped main body extending in a direction and an upper end portion having a side surface formed to be inclined. That is, the second conductivity type semiconductor 32' may be in direct contact with a parallel side surface of the active layer 33' and an inclined upper end portion of the first conductivity type semiconductor 31'. In an embodiment, the second conductivity type semiconductor 32' is not formed in the lower end portion of the first conductivity type semiconductor 31'.

An electrode material layer 37' is disposed to surround an outer surface of the second conductivity type semiconductor 32'. A shape of the electrode material layer 37' may be substantially the same as a shape of the second conductivity type semiconductor 32'. In an embodiment, the electrode material layer 37' may be entirely in contact with the outer surface of the second conductivity type semiconductor 32'.

An insulating film 38' may be disposed to surround the electrode material layer 37' and the outer surface of the first conductivity type semiconductor 31'. The insulating film 38' may be in direct contact with, in addition to the electrode material layer 37', the lower end portion of the first conductivity type semiconductor 31', and exposed lower end portions of the active layer 33' and the second conductivity type semiconductor 32'.

In concluding the detailed description, those skilled in the art will appreciate that many variations and modifications can be made to the described embodiments without substantially departing from the principles of the present invention. Therefore, the disclosed embodiments of the invention are provided in a generic and descriptive sense and not for purposes of limitation.

The invention claimed is:

1. A display device comprising:
a base layer;
a first electrode and a second electrode which are disposed on a surface of the base layer;
at least one light emitting element disposed between the first electrode and the second electrode and configured to emit light;
a protective layer disposed on the base layer to cover at least the first electrode, the second electrode, and the at least one light emitting element; and
an insulating layer disposed between the protective layer and the at least one light emitting element in a first direction perpendicular to the surface of the base layer,
wherein the protective layer includes a base material layer and a light emission pattern in which at least a partial region of a surface of the base material layer protrudes, the base material layer comprising at least one bead protruding from a top surface of the base material layer to form the light emission pattern,
wherein the at least one light emitting element comprises:
a first conductivity type semiconductor,
a second conductivity type semiconductor, and
an active layer disposed between the first conductivity type semiconductor and the second conductivity type semiconductor along a second direction different from the first direction, wherein the insulating layer directly contacts the at least one light emitting element, wherein the insulating layer does not overlap the active layer of the at least one light emitting element along the first direction, and wherein the insulating layer overlaps the first conductivity type semiconductor of the at least one light emitting element along the first direction.

2. The display device of claim 1, wherein at least a portion of the light emitted from the at least one light emitting element is incident on the light emission pattern, and at least a portion of the incident light is emitted from the light emission pattern to the surface of the base material layer in an upward direction.

3. The display device of claim 2, wherein the light emission pattern comprises a plurality of protrusions that contact one another, and wherein at least the partial region of the surface of the base material layer protrudes in the plurality of protrusions.

4. The display device of claim 3, wherein a protrusion of the plurality of protrusions has a curved shape of which an outer surface protrudes from the surface of the base material layer.

5. The display device of claim 4, wherein the protrusion has a shape extending from the surface of the base material layer in one direction.

6. The display device of claim 4, wherein the outer surface of the protrusion has a height of a highest point protruding from the surface of the base material layer in a range of 10 μm to 50 μm and has a diameter in a range of 20 μm to 100 μm.

7. The display device of claim 6, wherein the outer surface of the protrusion has a tangent angle formed with the surface of the base material layer in a range of 30° to 80°.

8. The display device of claim 7, wherein the outer surface of the protrusion is inclined from the surface of the base material layer.

9. The display device of claim 2, wherein the base material layer includes a transparent insulating material.

10. The display device of claim 1, wherein:

at least a portion of the light emitted from the at least one light emitting element is incident on the at least one bead; and the incident light is scattered in the at least one bead.

11. The display device of claim 1, wherein:

the base layer includes a light emission area defined as an area in which the at least one light emitting element is disposed; and the base material layer is disposed to cover the light emission area on the base layer.

12. The display device of claim 11, wherein the light emission pattern is disposed on at least a partial region on the base material layer and overlaps an alignment area.

13. The display device of claim 1, further comprising:

a first contact electrode contacting the first electrode and the light emitting element; and a second contact electrode contacting the second electrode and the light emitting element, wherein the light emitting element comprises a first portion overlapping the first electrode and a second portion overlapping the second electrode, wherein the first portion of the light emitting element is between the first contact electrode and the first electrode, and wherein the second portion of the light emitting element is between the second contact electrode and the second electrode.

* * * * *